US012633345B2

(12) United States Patent
    Wang

(10) Patent No.: US 12,633,345 B2
(45) Date of Patent: May 19, 2026

(54) THREE-DIMENSIONAL MEMORY DEVICE WITH A CUTTING STRUCTURE AND METHOD FOR FORMING THE SAME

(71) Applicant: YANGTZE MEMORY TECHNOLOGIES CO., LTD., Wuhan (CN)

(72) Inventor: Junbao Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 354 days.

(21) Appl. No.: 18/119,998

(22) Filed: Mar. 10, 2023

(65) Prior Publication Data

US 2023/0282281 A1     Sep. 7, 2023

Related U.S. Application Data

(63) Continuation of application No. PCT/CN2023/077398, filed on Feb. 21, 2023.

(30) Foreign Application Priority Data

Mar. 3, 2022     (CN) ......................... 202210202193.3

(51) Int. Cl.
    *G11C 16/04*     (2006.01)
    *H10B 41/10*     (2023.01)
    (Continued)

(52) U.S. Cl.
    CPC ......... *G11C 16/0483* (2013.01); *H10B 41/10* (2023.02); *H10B 41/27* (2023.02);
    (Continued)

(58) Field of Classification Search
    CPC ........ H10B 41/10; H10B 42/35; H10B 41/27; H10B 41/35; H10B 43/35; H10B 43/27; H10B 41/50; H10B 43/50
    See application file for complete search history.

(56) References Cited

U.S. PATENT DOCUMENTS 11,069,631 B2     7/2021   Onuma
2016/0204117 A1    7/2016   Liu et al.
              (Continued)

FOREIGN PATENT DOCUMENTS

CN     112259543 A     1/2021
CN     112992915 A     6/2021
WO     2021155557 A1    8/2021

OTHER PUBLICATIONS

International Search Report issued in corresponding International Application No. PCT/CN2023/077398, mailed Jun. 6, 2023, 3 pages.

(Continued)

*Primary Examiner* — Davienne N Monbleau
*Assistant Examiner* — Emily Farmer
(74) *Attorney, Agent, or Firm* — BAYES PLLC

(57)     ABSTRACT

A three-dimensional memory device includes memory arrays stacking in a first direction. Each of the memory arrays includes a stack structure including interleaved conductive layers and first dielectric layers extending in a second direction perpendicular to the first direction and a third direction perpendicular to the first direction and the second direction. The conductive layers include word lines and a drain select gate line, and the drain select gate line is separated by a second dielectric layer in the second direction.

20 Claims, 13 Drawing Sheets

(51) Int. Cl.
   *H10B 41/27*        (2023.01)
   *H10B 41/35*        (2023.01)
   *H10B 43/10*        (2023.01)
   *H10B 43/27*        (2023.01)
   *H10B 43/35*        (2023.01)

(52) U.S. Cl.
   CPC ............. *H10B 41/35* (2023.02); *H10B 43/10* (2023.02); *H10B 43/27* (2023.02); *H10B 43/35* (2023.02)

(56)                References Cited

U.S. PATENT DOCUMENTS

| | | | |
|---|---|---|---|
| 2021/0399049 A1 * | 12/2021 | Iizuka | G11C 13/0069 |
| 2022/0077182 A1 * | 3/2022 | Lee | H10B 43/35 |

OTHER PUBLICATIONS

Communication pursuant to Article 94(3) EPC issued in corresponding European application No. 23712771.7, mailed on Jun. 12, 2025, 6 pages.
Communication pursuant to Article 94(3) EPC issued in corresponding European Application No. 23712771.7, mailed Oct. 24, 2025, 7 pages.

\* cited by examiner

130

300

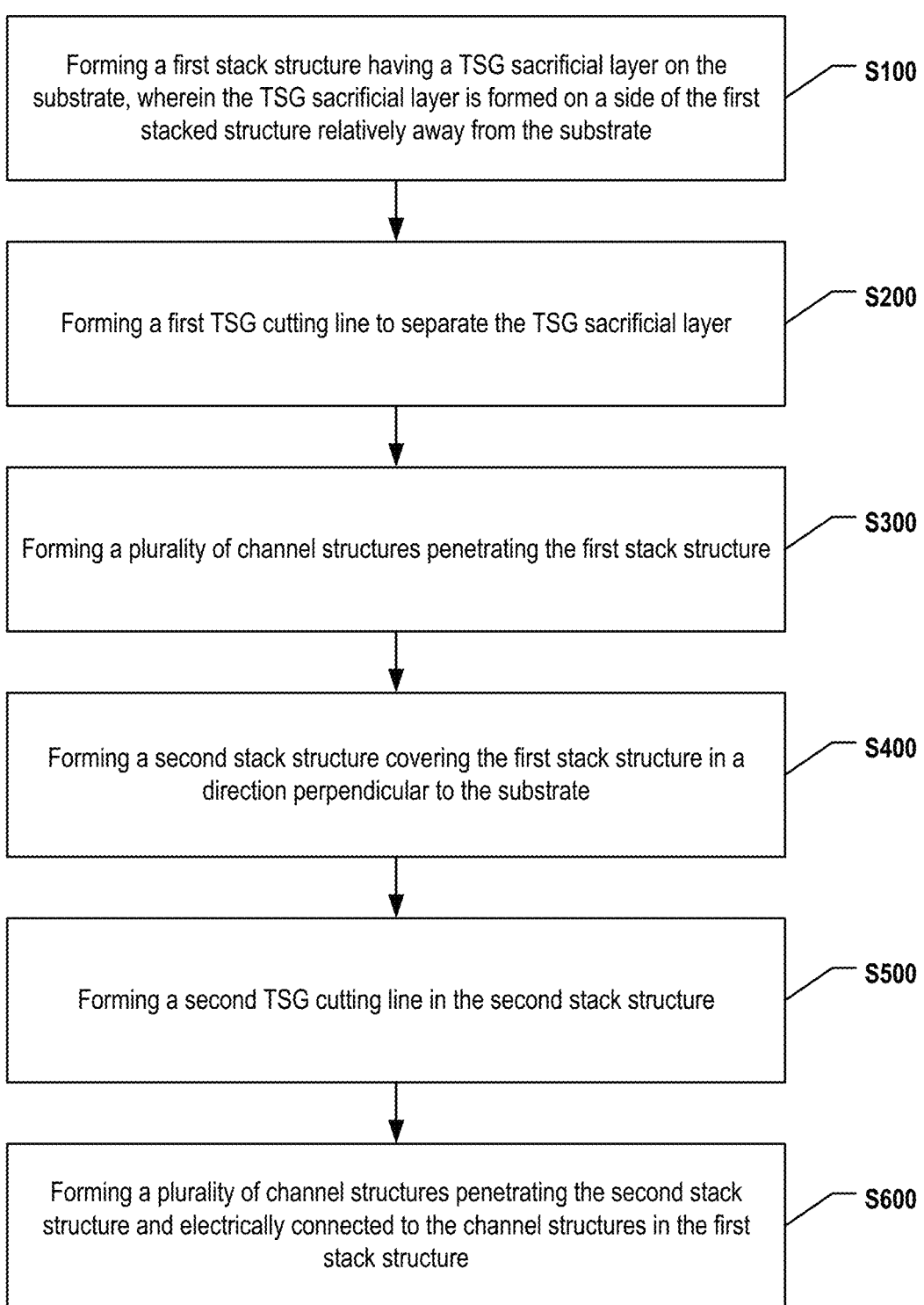

Forming a first stack structure having a TSG sacrificial layer on the substrate, wherein the TSG sacrificial layer is formed on a side of the first stacked structure relatively away from the substrate — S100

Forming a first TSG cutting line to separate the TSG sacrificial layer — S200

Forming a plurality of channel structures penetrating the first stack structure — S300

Forming a second stack structure covering the first stack structure in a direction perpendicular to the substrate — S400

Forming a second TSG cutting line in the second stack structure — S500

Forming a plurality of channel structures penetrating the second stack structure and electrically connected to the channel structures in the first stack structure — S600

FIG. 7

Forming a first memory array including a first cutting structure between channel structures — 902

Forming a second memory array above the first memory array, the second memory array including a second cutting structure between channel structure — 904

THREE-DIMENSIONAL MEMORY DEVICE WITH A CUTTING STRUCTURE AND METHOD FOR FORMING THE SAME

CROSS-REFERENCE TO RELATED APPLICATIONS

This application is a continuation of Internal Application No. PCT/CN2023/077398, filed Feb. 21, 2023, entitled "THREE-DIMENSIONAL MEMORY DEVICE AND METHOD FOR FORMING THE SAME," which claims the benefit of priority to Chinese Application No. 202210202193.3, filed on Mar. 3, 2022, both of which are incorporated herein by reference in their entireties.

BACKGROUND

The present disclosure relates to memory devices and methods for forming memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a 3D memory device is disclosed. The 3D memory device includes memory arrays stacking in a first direction. Each of the memory arrays includes a stack structure including interleaved conductive layers and first dielectric layers extending in a second direction perpendicular to the first direction and a third direction perpendicular to the first direction and the second direction. The conductive layers include word lines and a drain select gate line, and the drain select gate line is separated by a second dielectric layer in the second direction.

In some implementations, each of the memory arrays further includes a first channel structure extending in the first direction through the word lines and the drain select gate line.

In some implementations, each of the memory arrays further includes a second channel structure extending in the first direction through the word lines.

In some implementations, the second dielectric layer is disposed above the second channel structure.

In some implementations, a first length of the first channel structure in the first direction is larger than a second length of the second channel structure in the first direction.

In some implementations, each of the memory arrays further includes a first semiconductor layer disposed above the first channel structure, and a second semiconductor layer disposed above the second dielectric layer.

In some implementations, memory arrays include a first memory array and a second memory array disposed above the first memory array, and the second dielectric layer of the first memory array at least partially overlaps the second dielectric layer of the second memory array in a plan view of the 3D memory device.

In some implementations, the second semiconductor layer of the first memory array at least partially overlaps the second semiconductor layer of the second memory array in the plan view of the 3D memory device.

In some implementations, the first channel structure of the second memory array is in contact with the first semiconductor layer of the first memory array.

In some implementations, the second channel structure of the second memory array is in contact with the second semiconductor layer of the first memory array.

In some implementations, a top surface of the first semiconductor layer is coplanar to a top surface of the second semiconductor layer in the second direction.

In another aspect, a system is disclosed. The system includes a 3D memory device configured to store data and a memory controller. The 3D memory device includes memory arrays stacking in a first direction. Each of the memory arrays includes a stack structure including interleaved conductive layers and first dielectric layers extending in a second direction perpendicular to the first direction and a third direction perpendicular to the first direction and the second direction. The conductive layers include word lines and a drain select gate line, and the drain select gate line is separated by a second dielectric layer in the second direction. The memory controller is coupled to the 3D memory device and is configured to control operations of the channel structure through the select gate line and the word lines.

In still another aspect, a 3D memory device is disclosed. The 3D memory device includes a first stack structure including interleaved first conductive layers and first dielectric layers extending in a first direction and a second direction perpendicular to the first direction, first channel structures extending in a third direction perpendicular to the first direction and the second direction through the first stack structure, a second stack structure disposed above the first stack structure, including interleaved second conductive layers and second dielectric layers extending in the first direction and the second direction, second channel structures extending in the third direction through the second stack structure, first cutting structures disposed between the first channel structures, and second cutting structures disposed between the second channel structures.

In some implementations, the 3D memory device further includes a first dummy channel structure extending in the first stack structure in the third direction, and a second dummy channel structure extending in the second stack structure in the third direction above the first dummy channel structure. The first cutting structure is disposed between the first dummy channel structure and the second dummy channel structure.

In some implementations, the first dummy channel structure, the first cutting structure, and the second dummy channel structure at least partially overlap in a plan view of the 3D memory device.

In some implementations, the first conductive layers of the first stack structure include word lines and a drain select gate line, and the drain select gate line is separated by the first cutting structure.

In some implementations, the second conductive layers of the second stack structure include word lines and a drain select gate line, and the drain select gate line is separated by the second cutting structure.

In some implementations, the first cutting structure includes a third dielectric layer.

In some implementations, the 3D memory device further includes a semiconductor layer disposed between the first cutting structure and the second dummy channel structure.

In some implementations, the semiconductor layer is a doped semiconductor layer.

In yet another aspect, a system is disclosed. The system includes a 3D memory device configured to store data and a memory controller. The 3D memory device includes a first stack structure including interleaved first conductive layers and first dielectric layers extending in a first direction and a second direction perpendicular to the first direction, first channel structures extending in a third direction perpendicular to the first direction and the second direction through the first stack structure, a second stack structure disposed above the first stack structure, including interleaved second conductive layers and second dielectric layers extending in the first direction and the second direction, second channel structures extending in the third direction through the second stack structure, first cutting structures disposed between the first channel structures, and second cutting structures disposed between the second channel structures. The memory controller is coupled to the 3D memory device and is configured to control operations of the channel structure through the select gate line and the word lines.

In yet another aspect, a method for forming a 3D memory device is disclosed. A first memory array including a first cutting structure between first channel structures is formed. A second memory array is formed above the first memory array. The second memory array includes a second cutting structure between second channel structures.

In some implementations, a first dielectric stack including interleaved first dielectric layers and first sacrificial layers stacking in a first direction is formed. The first channel structures is formed through the first dielectric stack in the first direction. The first cutting structure is formed in a topmost layer of the first sacrificial layers. The first sacrificial layers are replaced with first conductive layers.

In some implementations, a second dielectric stack is formed on the first memory array, and the second dielectric stack includes interleaved second dielectric layers and second sacrificial layers stacking in the first direction. The second channel structures are formed through the second dielectric stack in the first direction. The second cutting structure is formed in a topmost layer of the second sacrificial layers.

In some implementations, the second sacrificial layers are replaced with second conductive layers.

In some implementations, a first stack structure including first word lines and a first drain select gate line is formed, and the first word lines and the first drain select gate line stack in a first direction. The first cutting structure is formed to cut the first drain select gate line. The first channel structure is formed extending in the first direction in the first stack structure.

In some implementations, a second stack structure is formed on the first stack structure, and the second stack structure includes second word lines and a second drain select gate line, and the second word lines and the second drain select gate line stack in the first direction. The second cutting structure is formed to cut the second drain select gate line. The second channel structure is formed extending in the first direction in the second stack structure.

In some implementations, a semiconductor layer is formed on the first channel structure.

In some implementations, the second cutting structure is formed at least partially overlapping the first cutting structure in a plan view of the 3D memory device.

In some implementations, a third memory array is formed above the second memory array, and the third memory array includes a third cutting structure between third channel structures.

In some implementations, the first cutting structure, the second cutting structure, and the third cutting structure at least partially overlap in a plan view of the 3D memory device.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 7 illustrates a flowchart of a method for forming a 3D memory device, according to some aspects of the present disclosure.

Figure 1A:
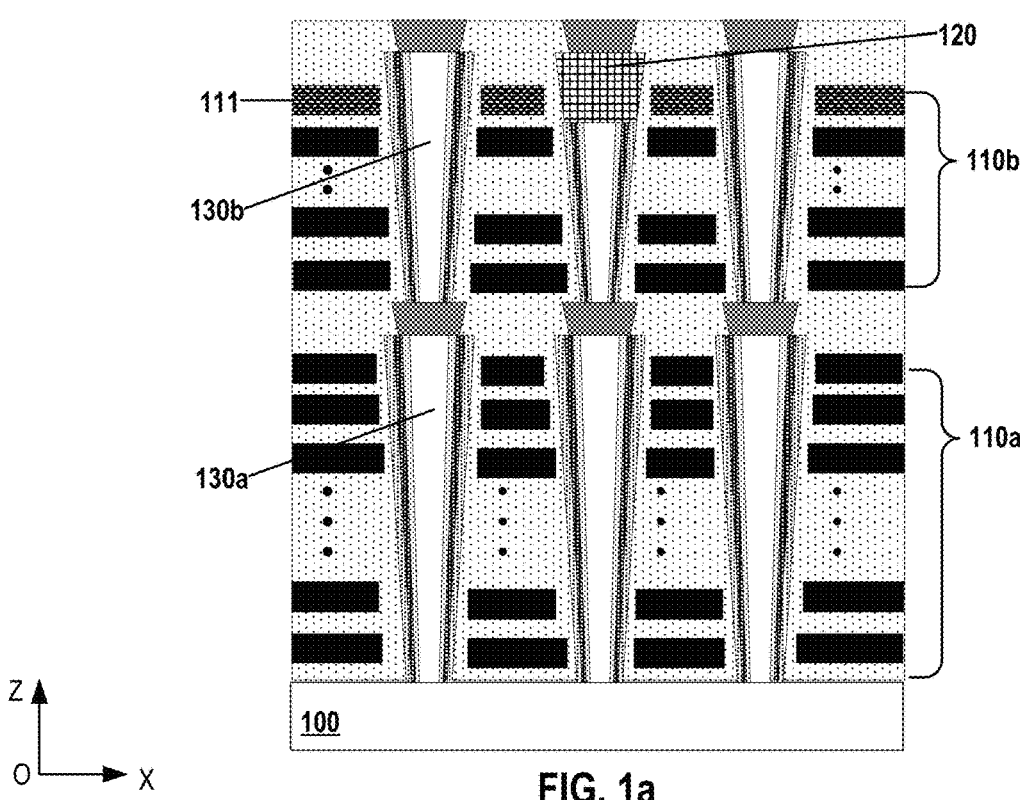
FIGS. 1a-1b illustrate schematic views of cross-sections of a 3D memory device.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a stack of gate electrodes may be arranged over a substrate, with a plurality of semiconductor channels through and intersecting word lines, into the implanted substrate. The bottom/lower gate electrode or electrodes function as source select gate lines, which are also called bottom select gates (BSG) in some cases. The top/upper gate electrode or electrodes function as drain select gate lines, which are also called top select gates (TSG) in some cases. The gate electrodes between the top/upper select gate electrodes and the bottom/lower gate electrodes function as word lines (WLs). The intersection of a word line and a semiconductor channel forms a memory cell.

Figure 1B:
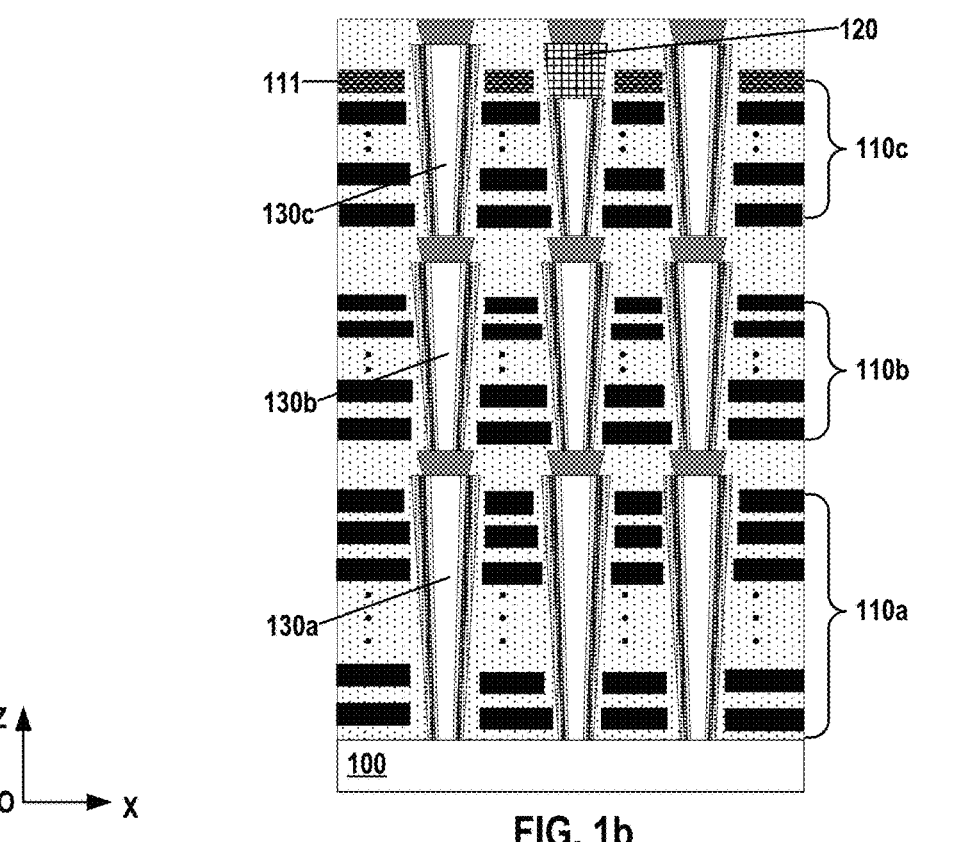

FIGS. 1a-1b illustrate schematic views of cross-sections of a 3D memory device. Referring to FIG. 1a, in some implementations, a three-dimensional memory includes a substrate 100, a first stack structure 110a, and a second stack structure 110b stacking in a direction perpendicular to the substrate 100. The second stack structure 110b further includes a TSG 111, which is located on a side of the second stack structure 110b relatively away from the substrate 100, a first channel structure 130a penetrating the first stack structure 110a, a second channel structure 130b penetrating the second stack structure 110b. The first channel structure 130a is electrically connected to the second channel structure 130b. A TSG cutting line 120 separates the TSG 111. In some implementations, TSG cutting line 120 may be named a dielectric layer or a cut structure.

Referring to FIG. 1b, the 3D memory device may include a plurality of stack structures, such as a third stack structure, a fourth stack structure, and an n-th stack structure, wherein n is a natural number. The n-th stack structure is a stack structure relatively away from the substrate 100, and the TSG 111 is located in the n-th stack structure. In some implementations, the 3D memory device may include a third channel structure, a fourth channel structure, and an n-th channel structure, wherein n is a natural number.

In some implementations, as shown in FIG. 1b that using n=3 as an example, the first channel structure 130a, the second channel structure 130b, and the third channel structure 130c are arranged in a stack manner and are electrically connected to each other. In some implementations, the TSG cutting line 120 is disposed only in the third stack structure 110c, and the TSG cutting lines are not provided in the first stack structure 110a and the second stack structure 110b. In some implementations, the TSG cutting line 120 divides the memory device into different memory blocks by penetrating the TSG 111. The first channel structure 130a, the second channel structure 130b, and the third channel structure 130c are stacked and electrically connected to each other, and the first channel structure 130a, the second channel structure 130b, and the third channel structure 130c are disposed in a same memory block.

When performing layer-by-layer read/write/erase operations on one memory block, three channel structures stacking in the same memory block need to be operated. Although the number of memory layers in the memory block is increased, the internal resistance is increased as well, and it is necessary to raise the operation voltage of read/write/erase operations to meet the operation requirements. Hence, the programming interference between the memory blocks increases due to the increase of the operating voltage, and cannot accurately control each memory block, thereby reducing the stability of the memory device. The present disclosure provides a 3D memory device and a manufacturing method to resolve at least one or more above problems.

Figure 2A:
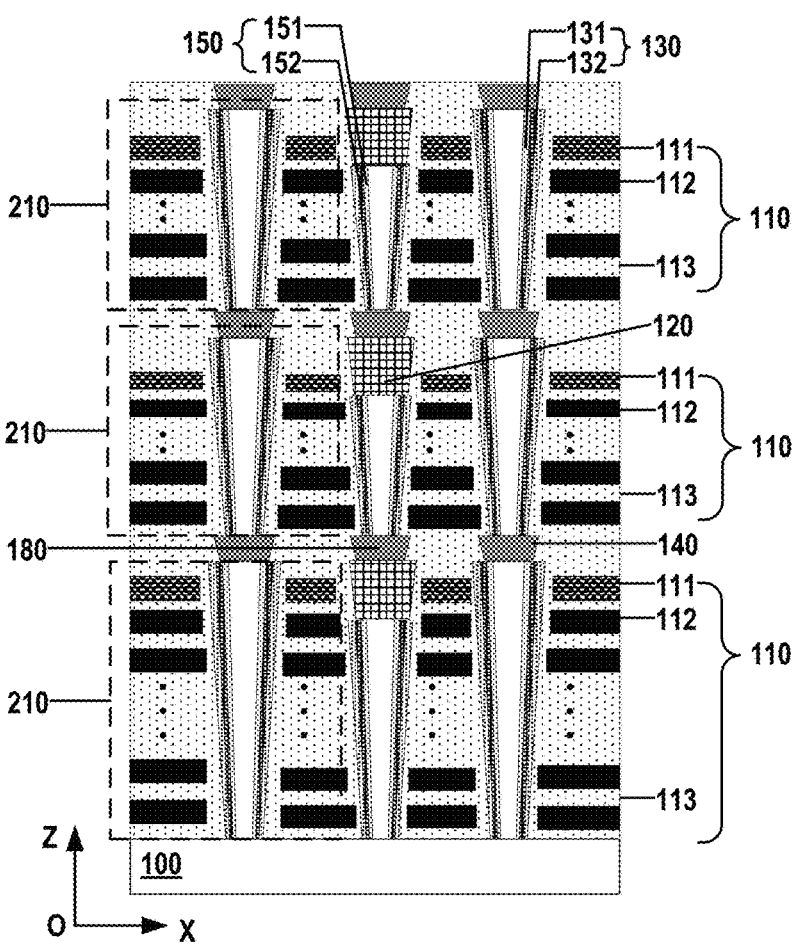
FIGS. 2a-2f illustrate schematic views of cross-sections of a 3D memory device, according to some aspects of the present disclosure.

FIG. 2a illustrates a schematic view of a cross-section of a 3D memory device, according to some aspects of the present disclosure. As shown in FIG. 2a, the 3D memory device includes the substrate 100, and at least two memory arrays stacked in a direction perpendicular to the substrate 100. In some implementations, each memory array includes the stack structure 110, the stack structure 110 includes the TSG 111, and the TSG 111 is located on a side of the stack structure 110 opposite to the substrate 100. Each memory array further includes a plurality of channel structures 130 penetrating the stack structure 110, and the TSG cutting line 120 separating the TSG 111. The TSG cutting line 120 is located between two adjacent channel structures 130 in a direction parallel to the substrate 100. The channel structures

130 are arranged in a stacked manner in the at least two memory arrays and are electrically connected.

In some implementations, the material of the substrate 100 may include single crystalline silicon (e.g., silicon or germanium), a group III-V semiconductor material, a group II-VI semiconductor material, an organic semiconductor material, or other suitable semiconductor materials. In some implementations, the material of the TSG 111 may include, but is not limited to, tungsten, cobalt, nickel, titanium, polysilicon, or other suitable materials. In some implementations, the material of the TSG cutting line 120 may include, but is not limited to, silicon oxide, silicon nitride, silicon oxynitride, or other suitable materials.

It is understood that the memory array in the disclosure is not limited to three layers shown in FIG. 2a, and different numbers of memory arrays may be stacked according to design and process requirements. In each memory array, the stack structure may include a gate layer and an insulating layer that are alternately stacked, the gate layers may serve as the word lines of the memory array, and read/write/erase operations may be implemented by applying different control voltages to the word lines. In some implementations, the number of the gate layers in the stack structure may include 8 layers, 16 layers, 32 layers, 64 layers, 96 layers, 128 layers, etc., and the implementations of the present disclosure are not specifically limited.

In some implementations, each stack structure 110 of each memory array may have the TSG 111, the TSG 111 may be a conductive layer parallel to the substrate 100, and the plurality of channel structures 130 may share the same TSG 111. The TSG 111 serves as a control gate of the top select transistor, and the top select transistor is turned on or off by controlling the voltage of the TSG 111, so as to control the channel structure 130 to implement read/write/erase operations. The TSG 111 is divided into two electrically insulated regions by the TSG cutting line 120 penetrating the TSG 111, so that each memory array is divided into two electrically insulated memory blocks 210.

Figure 2B:
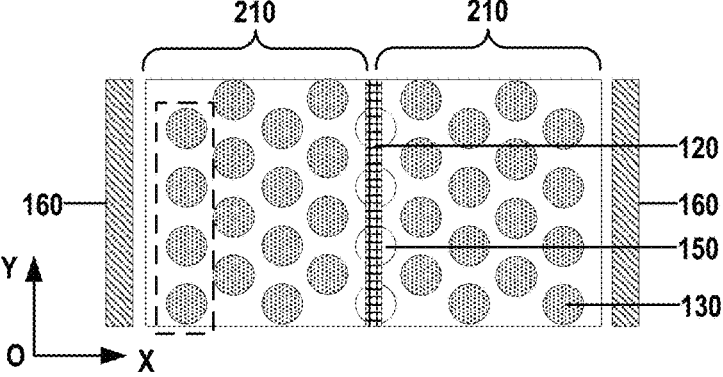

As shown in FIG. 2b, each memory block 210 may include one or more channel structures 130. In some implementations, one TSG cutting line 120 is disposed in each memory array. It is understood that the number of the TSG cutting line 120 is not limited to one, as shown in FIG. 2b, and may be changed to multiple TSG cutting lines 120 dividing the memory array into multiple memory blocks.

As shown in FIG. 2a, the memory array is stacked in the Z-direction, and the channel structures 130 in the adjacent memory arrays are stacked in the Z-direction. The adjacent stacked channel structures 130 are electrically connected in the Z-direction. It is understood that the manner of electrical connection may include direct contact between two adjacent channel structures 130 along the Z-direction to form an electrical connection, or may include providing a conductive structure (e.g., a conductive portion 140) between two adjacent channel structures 130 in the Z-direction and the conductive structure is in direct contact with the two adjacent channel structures 130.

In some implementations, the memory array is stacked in the direction perpendicular to the substrate, the TSG cutting line is provided in each memory array, and the TSG in each memory array is divided into a plurality of regions that are insulated from each other. By controlling the on and off of the top selection transistor in the memory array, the memory blocks in each memory array can be independently controlled. For example, when the read/write/erase operations are performed on the memory blocks in the n-th memory array, the memory blocks in the (n+1)-th memory array may not be used to perform the read/write/erase operations.

By using this structure, the number of the memory blocks may be increased in a direction perpendicular to the substrate while increasing the number of memory layers, so that more memory blocks may be defined on the same substrate to obtain more accurate control over the memory device. Compared with the related art that the channel structures stacked with each other constitute a memory block, the present disclosure reduces the number of memory layers in each memory block, thereby reducing the internal resistance of the memory block and reducing the programming interference between the memory blocks. Furthermore, when performing the read/write/erase operations on the memory block, the number of times that the memory unit is executed can be reduced because the number of memory layers is reduced, and therefore the lifetime of the memory device can be further extended.

In some implementations, a plurality of memory arrays are stacked to increase the number of memory layers, a TSG cutting line is provided in each memory array, and each memory array is divided into insulated memory blocks. The total number of memory layers is increased, and the memory blocks included in each memory array in the stacked memory array can independently perform the read/written/erase operations, thereby facilitating more accurate control of the memory device and improving the operation efficiency. Furthermore, by reducing the number of memory layers of the memory blocks in each memory array, the programming interference between the memory blocks may be reduced, the number of times that the memory units perform the read/write/erase operations is reduced, the lifetime of the memory device is extended, and the stability of the memory device is improved.

In some implementations, as shown in FIG. 2a, the 3D memory device further includes a semiconductor layer, e.g., the conductive portion 140, disposed between two adjacent memory arrays and configured to electrically connect two stacked channel structures 130. In the Z-direction, the conductive portion 140 is disposed between two adjacent channel structures 130 and is in contact with the top of one channel structure 130 and the bottom of one channel structure 130, so as to electrically connect the two channel structures 130. In some implementations, the two channel structures 130 respectively located at the upper end and the lower end of the conductive portion 140 do not need to be completely aligned. In some implementations, the critical dimensions (diameters) of the top and the bottom of the same channel structure 130 do not need to be completely consistent, and the electrical connection of the two channel structures 130 can be formed only by contacting the conductive portion 140. By using the conductive portion 140, the electrical connection area can be increased, the difficulty of the alignment process between the two stacked channel structures 130 may be reduced, and the manufacturing process window of the channel structures 130 can be increased.

In some implementations, the material of the conductive portion 140 may include tungsten, cobalt, nickel, titanium, polysilicon, or other suitable materials. As shown in FIG. 2a, the material of the semiconductor channel 131 in the channel structure 130 may include polysilicon, and the material of the conductive portion 140 may be the same as the semiconductor channel 131, which may increase the adhesion between the conductive portion 140 and the semiconductor channel 131 in the channel structure 130 and reduce the contact resistance to improve the electrical connection performance.

In some implementations, the polysilicon material of the conductive portion 140 may also be ion-doped to increase the carrier density of the conductive portion 140 and enhance the conductivity. In some implementations, the n-type doping may be performed on the polysilicon of the conductive portion 140.

In some implementations, as shown in FIG. 2a, the projections of the TSG cutting lines 120 in the at least two memory arrays may be overlapped in a direction perpendicular to the substrate 100. Each TSG cutting line 120 cuts the TSG 111 to divide each memory array into two memory blocks to enable separate read/write/erase operations for memory blocks included in each memory array. The position of the TSG cutting line 120 in each memory array may be different from and not be limited to the position of the TSG cutting line 120 in other memory arrays.

In some implementations, the projections of the TSG cutting lines 120 in each memory array may be overlapped, so that the forming position of the TSG cutting line 120 in each memory array may be the same to reduce the manufacturing cost. In some implementations, in the process of forming the TSG cutting lines 120 at the tops of different memory arrays, the position of the TSG cutting lines 120 may be determined by using the photoetching development technology, and the TSG cutting lines 120 at the same position can use the same mask to reduce the manufacturing cost.

In some implementations, as shown in FIG. 2a, the stack structure 110 may further include the gate layer 112 and the insulating layer 113 alternately stacked, wherein the insulating layer 113 electrically isolates the TSG 111 from the adjacent gate layers 112. In some implementations, the memory array further includes a dummy channel structure 150 penetrating the gate layer 112 and the insulating layer 113 and located below the TSG cutting line 120.

In some implementations, the material of the gate layer 112 may include tungsten, cobalt, nickel, titanium, polysilicon, or other suitable materials. In some implementations, the material of the insulating layer 113 may include silicon oxide, silicon nitride, silicon oxynitride, or other suitable materials.

The dummy channel structures 150 are located below the TSG cutting lines 120, the dummy channel structures 150 in the adjacent memory arrays are electrically isolated by the TSG cutting lines 120, and the read/write/erase operations are not performed in the dummy channel structures 150. The dummy channel structures 150 are used to support the stack structure 110. The dummy channel structure 150 may have the same structure as the channel structure 130 and may be formed simultaneously with the channel structure 130 to simplify the process steps and reduce the manufacturing cost.

In some implementations, as shown in FIG. 2a, a dummy conductive portion 180 may be disposed between adjacent memory arrays in the Z-direction perpendicular to the substrate 100, and the dummy conductive portion 180 is located between the adjacent TSG cutting line 120 and the dummy channel structure 150. In the Z-direction perpendicular to the substrate 100, the projection of the dummy conductive portion 180 may overlap with the projection of the TSG cutting line 120. The dummy conductive portion 180 is not used as an electrical connection to the dummy channel structure 150 and is used to support the dummy channel structure 150. The dummy conductive portion 180 may be formed simultaneously with the conductive portion 140 to simplify the manufacturing process and reduce the manufacturing cost.

Figure 2C:
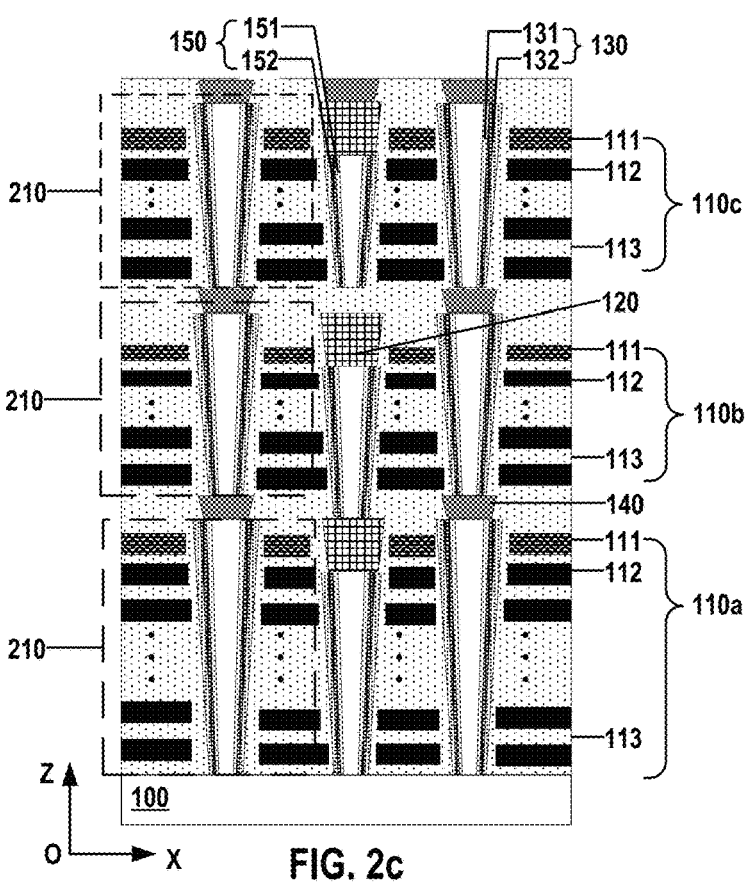

In some implementations, as shown in FIG. 2c, because the dummy channel structure 150 and the dummy conductive portion 180 are used for supporting the 3D memory device, and there is no need to play an electrical connection role. Therefore, in some implementations, the dummy conductive portion 180 may be omitted, and only the dummy channel structure 150 is provided to reduce the manufacturing costs.

As shown in FIG. 2c, the plurality of stack structures stacked in the Z-direction are represented by different labels to distinguish the related position. For example, the stack structure 110a, the stack structure 110b, and the stack structure 110c are shown in FIG. 2c, and the stack structure 110a, the stack structure 110b, and the stack structure 110c may have the same structure but are disposed at different positions.

In some implementations, the bottom of the dummy channel structure 150 may be in direct contact with the TSG cutting line 120. The bottom of the dummy channel structure 150 may extend to the insulating layer between two adjacent stack structures, not in contact with the TSG cutting line 120. For example, as shown in FIG. 2c, the bottom of the dummy channel structure 150 located in the stack structure 110b is in direct contact with the TSG cutting line 120 in the stack structure 110a. For another example, as shown in FIG. 2c, the bottom of the dummy channel structure 150 in the stack structure 110c may only extend into the insulating layer between the stack structure 110c and the stack structure 110b.

Figure 2D:
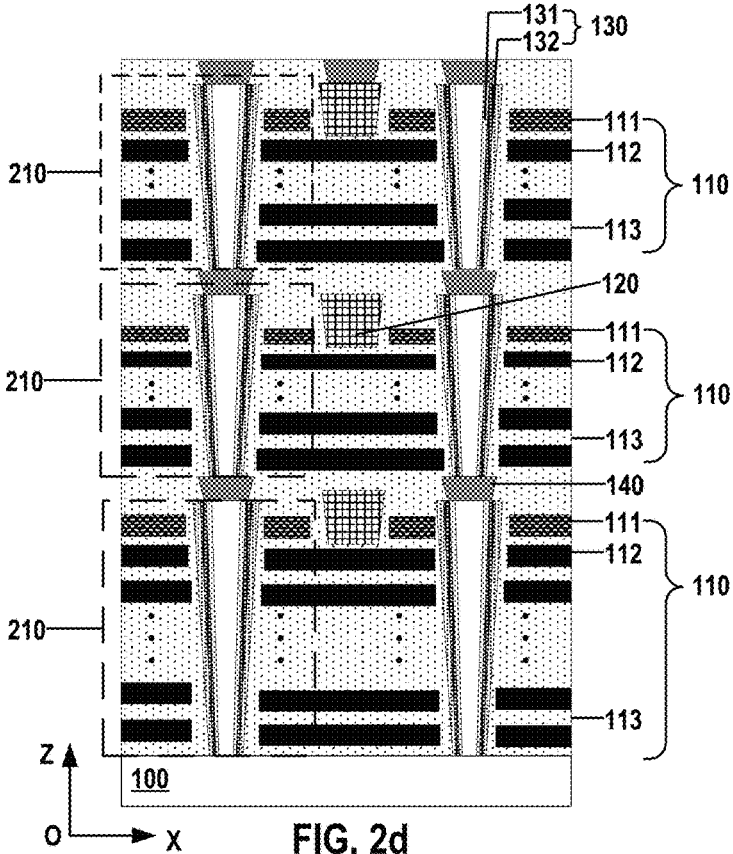

In some implementations, as shown in FIG. 2d, the 3D memory device is supported by the gate layer 112 and the insulating layer 113, and the dummy channel structure 150 and the dummy conductive portion 180 shown in FIG. 2a and FIG. 2c may be omitted, so as to reduce the manufacturing cost.

Figure 8A:
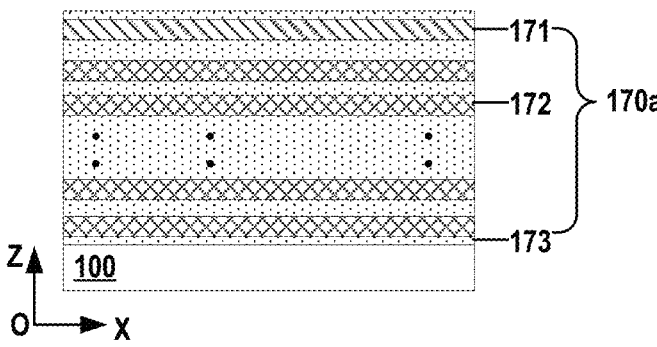
FIGS. 8a-8f illustrate a fabrication process for forming a 3D memory device, according to some aspects of the present disclosure.

As shown in FIG. 8a, in the manufacturing process of the stack structure 110, the stack structure 170a formed by alternately stacking the gate sacrificial layer 172 and the insulating layer 173 may be first formed, and then the gate sacrificial layer 172 in the stack structure 170a is removed to form a gap, and then the gate layer 112 is formed in the gap, e.g., the stack structure 110 shown in FIGS. 2a-2d. In other words, the stack structure 110 may be formed by the gate-after processes. When removing the gate sacrificial layer 172, to avoid the collapse and deformation of the insulating layer 173 (i.e., the insulating layer 113 in FIG. 2c and FIG. 2d), the dummy channel structure 150 may be formed to support the 3D memory device to improve the device yield.

In some implementations, the stack structure 110 may be formed by alternately stacking the gate layer 112 and the insulating layer 113 without forming the gate sacrificial layer 172, and the stack structure 110a is formed by the gate-first processes. In some implementations, the arrangement of the dummy channel structure 150 in FIG. 2c can be omitted, and the gate layer 112 and the insulating layer 113 in the stack structure 110 are supported to reduce the manufacturing cost.

In some implementations, as shown in FIG. 2b, the memory array further includes at least two gate line slit (GLS) structures 160, and the GLS structures 160 are arranged in parallel. Each GLS structure 160 penetrates the stack structure, and at least one TSG cutting line 120 is disposed between two adjacent GLS structures 160. A channel structure 130 is disposed between the GLS structure 160 and the TSG cutting line 120.

In some implementations, each memory array includes at least two GLS structures 160 penetrating the stack structure 110. In the Z-direction perpendicular to the substrate 100, the projections of the GLS structures 160 in two adjacent memory arrays overlap each other. In some implementations, the plurality of stacked memory arrays share a plurality of GLS structures 160. For example, illustrating by one GLS structure 160, in the direction perpendicular to the substrate 100, the GLS structure 160 is configured to penetrate all stacked structures 110.

In some implementations, the GLS structure 160 penetrating the stack structure 110 divides the memory array into different memory regions, and the channel structures 130 in the middle of two GLS structures 160 together form a memory region. The GLS structure 160 may serve as an isolation structure to isolate and support the memory array. The GLS structure 160 may also include a conductive core portion for supplying power to the common source electrode of the channel structure 130. The TSG cutting line 120 is disposed between two adjacent GLS structures 160, and the memory region is further divided into different sub-arrays, each sub-array is a memory block 210, and each memory block 210 may perform read/write/erase operation independently.

It is understood that the number of the GLS structures 160 and the TSG cutting lines 120 shown in the disclosure is merely for illustration, and different numbers of GLS structures 160 and the TSG cutting lines 120 may be set to divide the memory array into a plurality of memory blocks and each memory block may include one or more channel structures according to design requirements and manufacturing processes. Hence, the division and independent control of the memory block can achieve finer programming control over the memory device and improve the operation efficiency. Further, the number of the channel structures controlled at the same time is reduced, the programming interference in the memory device is therefore reduced, and the stability of the memory device is improved.

As shown in FIG. 2b, the channel structures 130 between two adjacent GLS structures 160 are periodically arranged in an array manner. The TSG cutting lines 120 and the GLS structures 160 divide the array into sub-arrays, and each sub-array has the same number of channel structures 130. The channel structures 130 between two adjacent GLS structures 160 are periodically arranged in an array manner, so that the layout density of the channel structures 130 can be increased, and alignment and contact between the bit lines and the top of the channel structure s130 can also be facilitated.

As shown in FIG. 2b, in the X-direction parallel to the substrate, the TSG cutting line 120 and the GLS structure 160 divide the memory array into different sub-arrays, and each sub-array has the same number of channel structures 130, e.g., 4 rows or 8 rows. Each sub-array is disposed with the channel structures 130 having the same number of rows, which is beneficial to balancing the operating voltage of each sub-array, facilitating the read/write/erase operation, and improving the stability of the memory device. The plurality of channel structures 130 arranged along the extension direction of the TSG cutting line 120 and the GLS structure 160 form a row of channel structures 130. For example, as shown by the dashed line in FIG. 2b, a plurality of channel structures 130 arranged side by side along the Y-direction may be referred to as a row of channel structures 130, and each sub-array includes four rows of channel structures 130. In some implementations, the Y-direction may be the extension direction of the word lines, and the X-direction may be the extension direction of the bit lines.

In some implementations, as shown in FIG. 2a, the channel structure 130 includes a semiconductor channel 131 and a memory film 132 surrounding the semiconductor channel 131. The semiconductor channels 131 arranged in a stacked manner in two adjacent memory arrays are electrically connected by the conductive portion 140. The plurality of conductive portions 140 are electrically isolated from each other in a direction parallel to the substrate 100.

In the Z-direction perpendicular to the substrate 100, adjacent stacked semiconductor channels 131 are electrically connected by the conductive portions 140, so as to realize the conduction of each semiconductor channel 131. The conductive portion 140 may include ion-doped polysilicon, and the doping type includes n-type doping to increase the carrier density of the conductive portion 140 and enhance the conductivity. In some implementations, the Z-direction may be the extension direction of semiconductor channels 131.

Figure 2E:
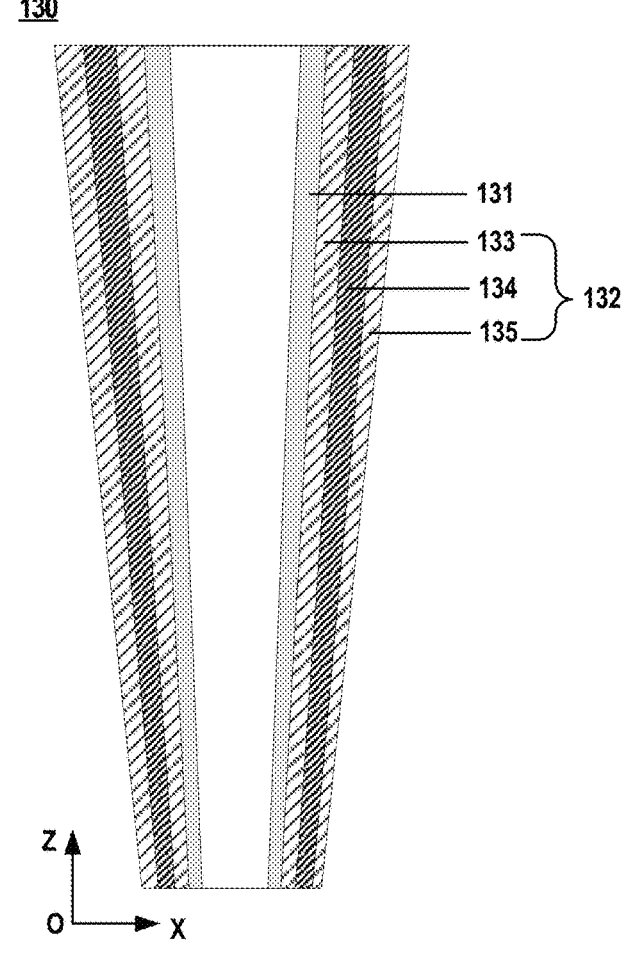

FIG. 2e illustrates a schematic diagram of the channel structure 130, according to some aspects of the present disclosure. As shown in FIG. 2e, along the radial direction of the channel structure 130, the memory film 132 includes a blocking layer 135, a storage layer 134, and a tunneling layer 133. The blocking layer 135 may include silicon oxide, silicon oxynitride, high dielectric material, or any combination thereof. The storage layer 134 may include silicon nitride, silicon oxynitride, silicon, or any combination thereof. The tunneling layer 133 may include silicon oxide, silicon oxynitride, or any combination thereof. In some implementations, the memory film 132 may be a composite layer of silicon oxide/silicon nitride/silicon oxide (ONO).

In some implementations, the tunneling layer 133 is located between the semiconductor channel 131 and the storage layer 134. The storage layer 134 is also referred to as a charge trapping layer, and the storage or removal of the charge in the charge trapping layer determines the switching state of the semiconductor channel. The charge moves between the storage layer 134 and the semiconductor channel 131 through the tunneling effect of the tunneling layer 133 to realize turning on/off the semiconductor channel 131, and then realizes storing and erasing through programming. The storage layer 134 may store charges, and when the memory device is powered off, the charges can be stored in the storage layer 134. The blocking layer 135 is located between the storage layer 134 and the gate layer for isolation. When the memory device is powered off, the charges in the storage layer 134 are blocked from moving to the gate layer, thereby preventing data loss.

Figure 2F:
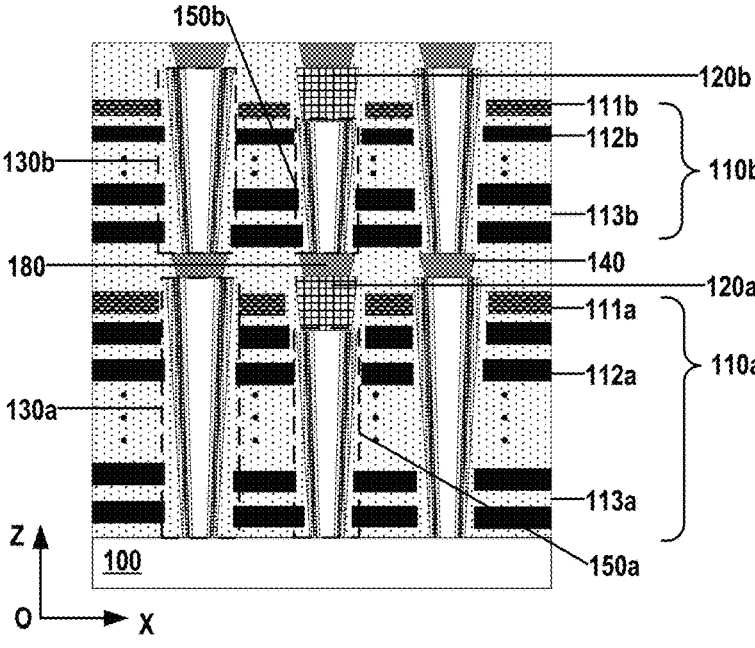

In some implementations, as shown in FIG. 2f, the 3D memory device may include the substrate 100; a first stack structure 110a including a first TSG 111a, the first TSG 111a located on a side of the first stack structure 110a relatively away from the substrate 100; a plurality of first channel structures 130a penetrating the first stack structure 110a; the first TSG cutting line 120a dividing the first TSG 111a, wherein the first TSG cutting line 120a is located between two adjacent first channel structures 130a in a direction parallel to the substrate; the second stack structure 110b including a second TSG 111b, and the second TSG 111b is located on a side of the second stack structure 110b relatively away from the substrate 100; a plurality of second channel structures 130b penetrating the second stack structure 110b; the second TSG cutting line 120b dividing the first TSG 111b, wherein the second TSG cutting line 120b is located between two adjacent second channel structures 130*b* in a direction parallel to the substrate; and the first stack structure 110*a* and the second stack structure 110*b* stacked in a direction perpendicular to the substrate, wherein the stacked first channel structure 130*a* is electrically connected to the second channel structure 130*b*.

In some implementations, as shown in FIG. 2*f*, in the Z-direction perpendicular to the substrate 100, the second stack structure 110*b* may be located above the first stack structure 110*a*. The first stack structure 110*a* and the second stack structure 110*b* shown in FIG. 2*f* are for illustration only, and the 3D memory device may further include more stack structures. For example, in the Z-direction, a third stack structure may be stacked on the second stack structure 110*b*, and a fourth stack structure may be stacked on the third stack structure. The number of stack structures is not limited in the disclosure.

As shown in FIG. 2*f*, in the Z-direction, the adjacent first and second channel structures 130*a* and 130*b* are electrically connected. It is understood that the first channel structure 130*a* and the second channel structure 130*b* may be electrically connected by direct contact. For example, the semiconductor channel contacts in the first channel structure 130*a* and the second channel structure 130*b* are electrically connected. For another example, the electrical connection may also include providing a conductive structure (e.g., the conductive portion 140) between the first channel structure 130*a* and the second channel structure 130*b* adjacent in the Z-direction. The conductive structure is in direct contact with the first channel structure 130*a* and the second channel structure 130*b*. It should be noted that the first channel structure 130*a* and the second channel structure 130*b* are both channel structures, and the structures may be the same or different, and the positions may be different as well.

In some implementations, as shown in FIG. 2*f*, the 3D memory device may further include the conductive portion 140 located between the first stack structure 110*a* and the second stack structure 110*b* for electrically connecting the first channel structure 130*a* and the second channel structure 130*b*.

As shown in FIG. 2*f*, in the Z-direction, the conductive portion 140 is formed between adjacent first channel structures 130*a* and second channel structures 130*b*, and is in contact with the top of the first channel structure 130*a* and the bottom of the second channel structure 130*b* to implement an electrical connection between the first channel structure 130*a* and the second channel structure 130*b*. The conductive portion 140 may increase the electrical connection area of the first channel structure 130*a* and the second channel structure 130*b*, reduce the alignment difficulty of the first channel structure 130*a* and the second channel structure 130*b*, and facilitate the expansion of the process window forming the first channel structure 130*a* and the second channel structure 130*b*.

In some implementations, as shown in FIG. 2*f*, in a direction perpendicular to the substrate 100, projections of the first TSG cutting line 120*a* and the second TSG cutting line 120*b* may overlap. The forming position of the first TSG cutting line 120*a* in the first stack structure 110*a* may be the same as the forming position of the second TSG cutting line 120*b* in the second stack structure 110*b*, so that the projection of the first TSG cutting line 120*a* and the second TSG cutting line 120*b* in the Z-direction overlap. Therefore, in the manufacturing process of the first TSG cutting line 120*a* and the second TSG cutting line 120*b*, the same mask can be used to reduce the manufacturing cost.

In some implementations, the 3D memory device may further include the first dummy channel structure 150*a* penetrating the first stack structure 110*a* and located below the first TSG cutting line 120*a*; and the second dummy channel structure 150*b* penetrating the second stack structure 110*b* and located below the second TSG cutting line 120*b*.

The first dummy channel structure 150*a* and the second dummy channel structure 150*b* are not used for storing data, and are used for supporting the 3D memory device, so that the structural stability of the memory device is improved, the collapse and deformation conditions of the first stack structure 110*a* and the second stack structure 110*b* are reduced, and the stability of the memory device is improved.

Figure 3:
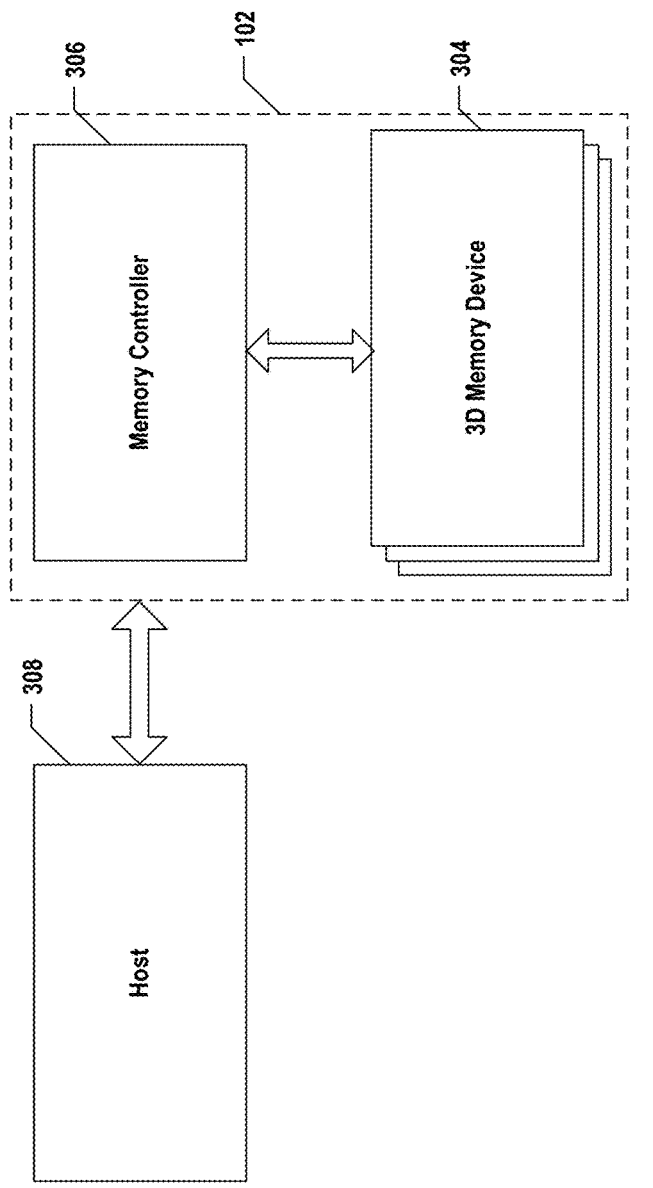
FIG. 3 illustrates a block diagram of a system having a memory device, according to some aspects of the present disclosure.

FIG. 3 illustrates a block diagram of a system 300 having a memory device, according to some aspects of the present disclosure. System 300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 3, system 300 can include a host 308 and a memory system 302 having one or more memory devices 304 and a memory controller 306. Host 308 can be a processor of an electronic device, such as a central processing unit (CPU), or a system-on-chip (SoC), such as an application processor (AP). Host 308 can be configured to send or receive data to or from memory devices 304.

Memory device 304 can be any memory device disclosed in the present disclosure. As disclosed above in detail, memory device 304, such as a NAND Flash memory device, may have a controlled and predefined discharge current in the discharge operation of discharging the bit lines. Memory controller 306 is coupled to memory device 304 and host 308 and is configured to control memory device 304, according to some implementations. Memory controller 306 can manage the data stored in memory device 304 and communicate with host 308. For example, memory controller 306 may be coupled to memory device 304, and memory controller 306 may be configured to control the operations of channel structure through the peripheral device.

In some implementations, memory controller 306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 306 is designed for operating in a high duty-cycle environment SSDs or embedded multi-media-cards (eMMCs) used as data storage for mobile devices, such as smartphones, tablets, laptop computers, etc., and enterprise storage arrays. Memory controller 306 can be configured to control operations of memory device 304, such as read, erase, and program operations. Memory controller 306 can also be configured to manage various functions with respect to the data stored or to be stored in memory device 304 including, but not limited to bad-block management, garbage collection, logical-to-physical address conversion, wear leveling, etc. In some implementations, memory controller 306 is further configured to process error correction codes (ECCs) with respect to the data read from or written to memory device 304. Any other suitable functions may be performed by memory controller 306 as well, for example, formatting memory device 304. Memory controller 306 can communicate with an external device (e.g., host 308) according to a particular communication protocol. For example, memory controller 306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 4B:
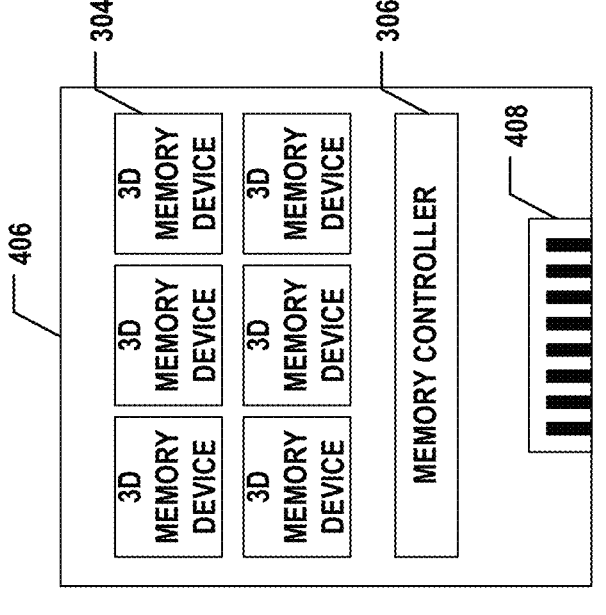
FIG. 4b illustrates a diagram of a solid-state drive (SSD) having a memory device, according to some aspects of the present disclosure.
Figure 4A:
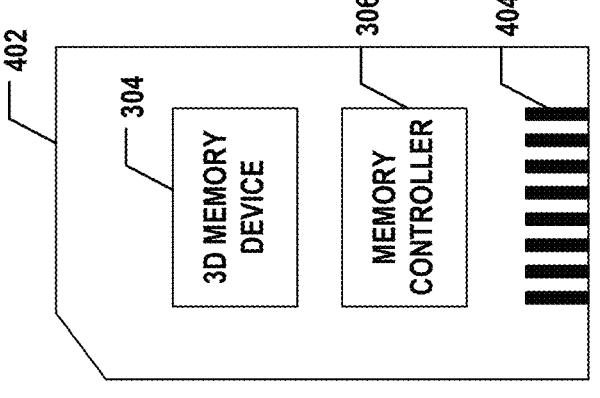
FIG. 4a illustrates a diagram of a memory card having a memory device, according to some aspects of the present disclosure.

Memory controller 306 and one or more memory devices 304 can be integrated into various types of storage devices, for example, be included in the same package, such as a universal Flash storage (UFS) package or an eMMC package. That is, memory system 302 can be implemented and packaged into different types of end electronic products. In one example as shown in FIG. 4a, memory controller 306 and a single memory device 304 may be integrated into a memory card 402. Memory card 402 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 402 can further include a memory card connector 404 coupling memory card 402 with a host (e.g., host 308 in FIG. 3). In another example as shown in FIG. 4b, memory controller 306 and multiple memory devices 304 may be integrated into an SSD 406. SSD 406 can further include an SSD connector 408 coupling SSD 406 with a host (e.g., host 308 in FIG. 3). In some implementations, the storage capacity and/or the operation speed of SSD 406 is greater than those of memory card 402.

Figure 5:
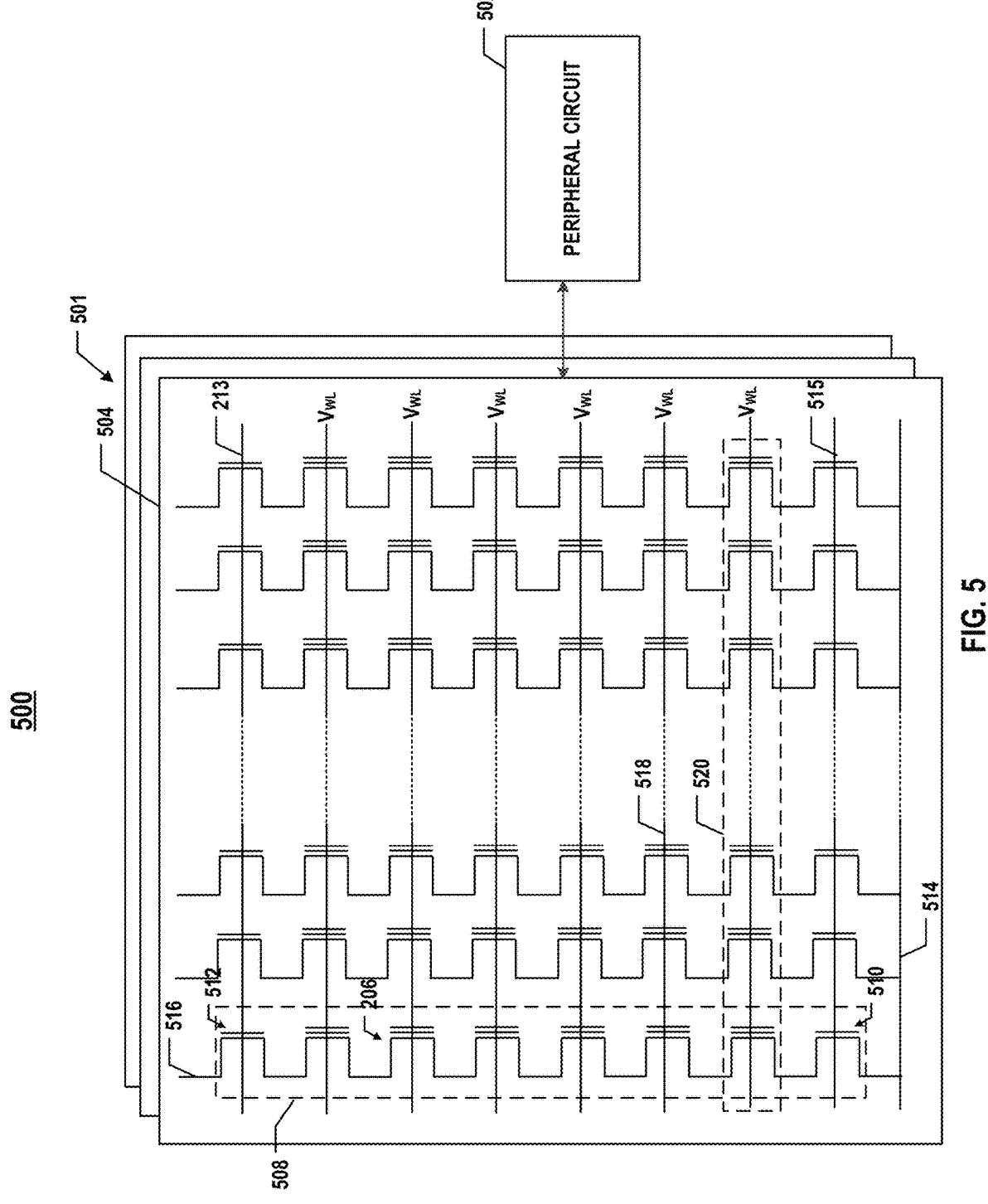
FIG. 5 illustrates a diagram of a memory device having a peripheral circuit, according to some aspects of the present disclosure.

FIG. 5 illustrates a schematic circuit diagram of a memory device 500 including peripheral circuits, according to some aspects of the present disclosure. Memory device 500 can include a memory cell array 501 and peripheral circuits 502 coupled to memory cell array 501. 3D memory devices 304 may be examples of memory device 500.

Memory cell array 501 can be a NAND Flash memory cell array in which memory cells 506 are provided in the form of an array of NAND memory strings 508 each extending vertically above a substrate (not shown in FIG. 5). In some implementations, each NAND memory string 508 includes a plurality of memory cells 506 coupled in series and stacked vertically. Each memory cell 506 can hold a continuous, analog value, such as an electrical voltage or charge, that depends on the number of electrons trapped within a region of memory cell 506. Each memory cell 506 can be either a floating gate type of memory cell including a floating-gate transistor or a charge trap type of memory cell including a charge-trap transistor.

In some implementations, each memory cell 506 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 506 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 5, each NAND memory string 508 can include a source select gate (SSG) transistor 510 at its source end and a drain select gate (DSG) transistor 512 at its drain end. SSG transistor 510 and DSG transistor 512 can be configured to activate selected NAND memory strings 508 (columns of the array) during read and program operations. In some implementations, SSG transistors 510 of NAND memory strings 508 in the same block 504 are coupled through a same source line (SL) 514, e.g., a common SL, for example, to the ground. DSG transistor 512 of each NAND memory string 508 is coupled to a respective bit line 516 from which data can be read or programmed via an output bus (not shown), according to some implementations. In some implementations, each NAND memory string 508 is configured to be selected or deselected by applying a select voltage (e.g., above the threshold voltage of DSG transistor 512) or a deselect voltage (e.g., 0 V) to respective DSG transistor 512 through one or more DSG lines 513 and/or by applying a select voltage (e.g., above the threshold voltage of SSG transistor 510) or a deselect voltage (e.g., 0 V) to respective SSG transistor 510 through one or more SSG lines 515.

As shown in FIG. 5, NAND memory strings 508 can be organized into multiple blocks 504, each of which can have a common source line 514. In some implementations, each block 504 is the basic data unit for erase operations, i.e., all memory cells 506 on the same block 504 are erased at the same time. Memory cells 506 of adjacent NAND memory strings 508 can be coupled through word lines 518 that select which row of memory cells 506 is affected by read and program operations. In some implementations, each word line 518 is coupled to a page 520 of memory cells 506, which is the basic data unit for program and read operations. The size of one page 520 in bits can correspond to the number of NAND memory strings 508 coupled by word line 518 in one block 504. Each word line 518 can include a plurality of control gates (gate electrodes) at each memory cell 506 in respective page 520 and a gate line coupling the control gates.

Figure 6:
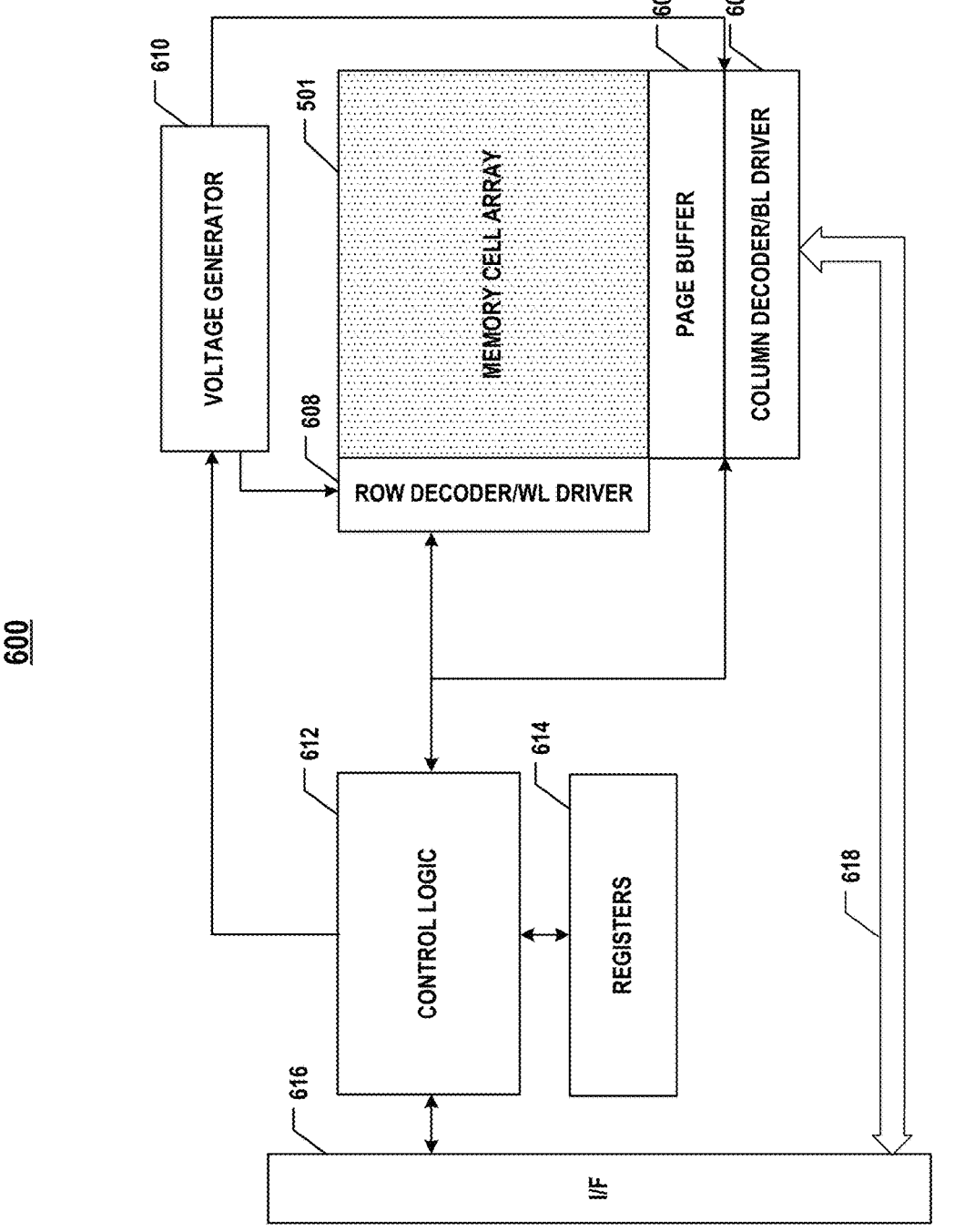
FIG. 6 illustrates a block diagram of a memory device having a peripheral circuit, according to some aspects of the present disclosure.

Peripheral circuits 502 can be coupled to memory cell array 501 through bit lines 516, word lines 518, source lines 514, SSG lines 515, and DSG lines 513. As described above, peripheral circuits 502 can include any suitable circuits for facilitating the operations of memory cell array 501 by applying and sensing voltage signals and/or current signals through bit lines 516 to and from each target memory cell 506 through word lines 518, source lines 514, SSG lines 515, and DSG lines 513. Peripheral circuits 502 can include various types of peripheral circuits formed using CMOS technologies. For example, FIG. 6 illustrates some peripheral circuits 502 including a page buffer 604, a column decoder/bit line driver 606, a row decoder/word line driver 608, a voltage generator 610, control logic 612, registers 614, an interface (I/F) 616, and a data bus 618. It is understood that in some examples, additional peripheral circuits 502 may be included as well.

Page buffer 604 can be configured to buffer data read from or programmed to memory cell array 501 according to the control signals of control logic 612. In one example, page buffer 604 may store one page of program data (write data) to be programmed into one page 520 of memory cell array 501. In another example, page buffer 604 also performs program verify operations to ensure that the data has been properly programmed into memory cells 506 coupled to selected word lines 518.

Row decoder/word line driver 608 can be configured to be controlled by control logic 612 and select block 504 of memory cell array 501 and a word line 518 of selected block 504. Row decoder/word line driver 608 can be further configured to drive memory cell array 501. For example, row decoder/word line driver 608 may drive memory cells 506 coupled to the selected word line 518 using a word line voltage generated from voltage generator 610.

Column decoder/bit line driver 606 can be configured to be controlled by control logic 612 and select one or more 3D NAND memory strings 508 by applying bit line voltages generated from voltage generator 610. For example, column decoder/bit line driver 606 may apply column signals for selecting a set of N bits of data from page buffer 604 to be outputted in a read operation.

Control logic 612 can be coupled to each peripheral circuit 502 and configured to control operations of peripheral circuits 502. Registers 614 can be coupled to control logic 612 and include status registers, command registers, and address registers for storing status information, command operation codes (OP codes), and command addresses for controlling the operations of each peripheral circuit 502.

Interface 616 can be coupled to control logic 612 and configured to interface memory cell array 501 with a memory controller (not shown). In some implementations, interface 616 acts as a control buffer to buffer and relay control commands received from the memory controller and/or a host (not shown) to control logic 612 and status information received from control logic 612 to the memory controller and/or the host. Interface 616 can also be coupled to page buffer 604 and column decoder/bit line driver 606 via data bus 618 and act as an I/O interface and a data buffer to buffer and relay the program data received from the memory controller and/or the host to page buffer 604 and the read data from page buffer 604 to the memory controller and/or the host. In some implementations, interface 616 and data bus 618 are parts of an I/O circuit of peripheral circuits 502.

Voltage generator 610 can be configured to be controlled by control logic 612 and generate the word line voltages (e.g., read voltage, program voltage, pass voltage, local voltage, and verification voltage) and the bit line voltages to be supplied to memory cell array 501. In some implementations, voltage generator 610 is part of a voltage source that provides voltages at various levels of different peripheral circuits 502 as described below in detail. Consistent with the scope of the present disclosure, in some implementations, the voltages provided by voltage generator 610, for example, to row decoder/word line driver 608, column decoder/bit line driver 606, and page buffer 604 are above certain levels that are sufficient to perform the memory operations. For example, the voltages provided to the page buffer circuits in page buffer 604 and/or the logic circuits in control logic 612 may be between 1.3 V and 5 V, such as 3.3 V, and the voltages provided to the driving circuits in row decoder/word line driver 608 and/or column decoder/bit line driver 606 may be between 5 V and 30 V.

FIG. 7 illustrates a flowchart of a method for forming a 3D memory device, according to some aspects of the present disclosure. FIGS. 8a-8f illustrate a fabrication process for forming a 3D memory device, according to some aspects of the present disclosure. As shown in FIGS. 7 and 8a-8f, the method includes the following steps:

S100: as shown in FIG. 8a, forming a first stack structure 170a having a TSG sacrificial layer 171 on the substrate 100, wherein the TSG sacrificial layer 171 is formed on a side of the first stacked structure 170a relatively away from the substrate 100.

Figure 8B:
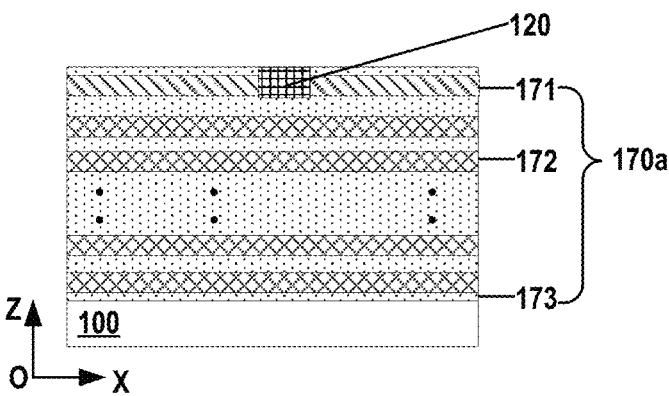

S200: as shown in FIG. 8b, in the first stack structure 170a, forming a first TSG cutting line 120 to separate the TSG sacrificial layer 171.

Figure 8C:
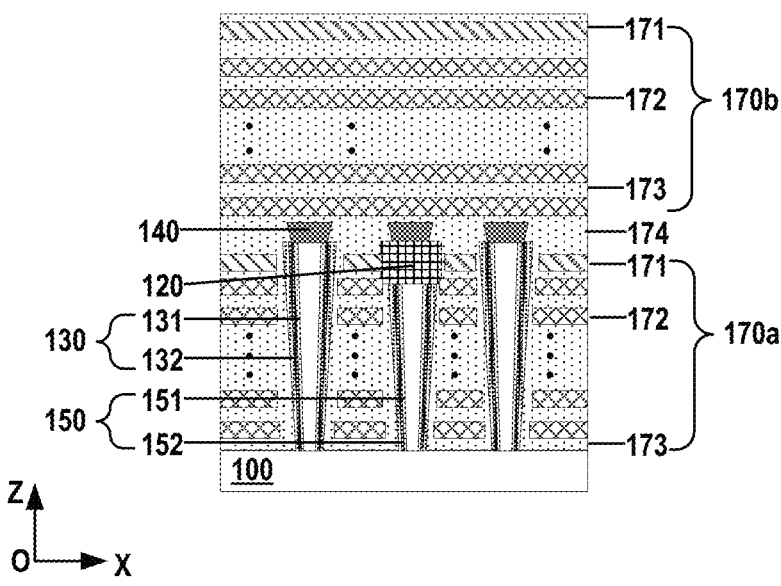

S300: as shown in FIG. 8c, forming a plurality of channel structures 130 penetrating the first stack structure 170a.

S400: as shown in FIG. 8c, forming a second stack structure 170b covering the first stack structure 170a in a direction perpendicular to the substrate 100.

Figure 8D:
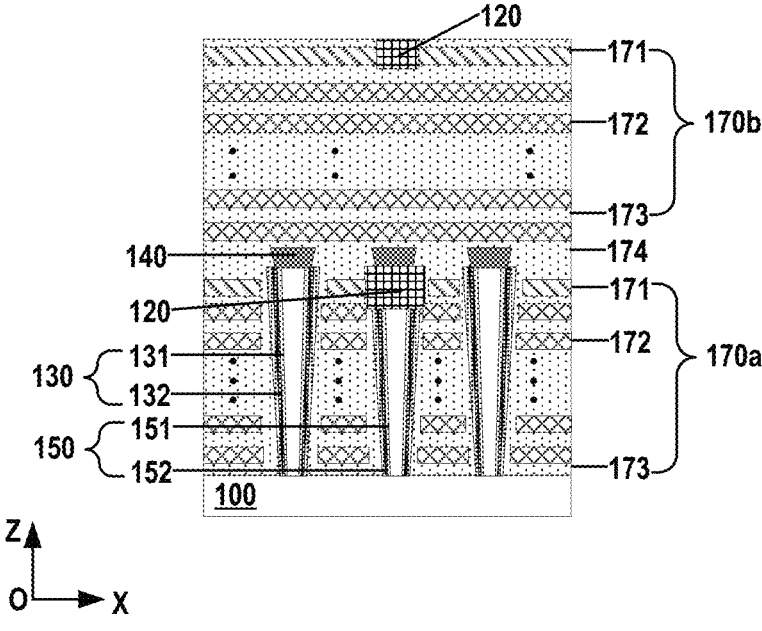

S500: as shown in FIG. 8d, forming a second TSG cutting line 120 in the second stack structure 170b.

Figure 8E:
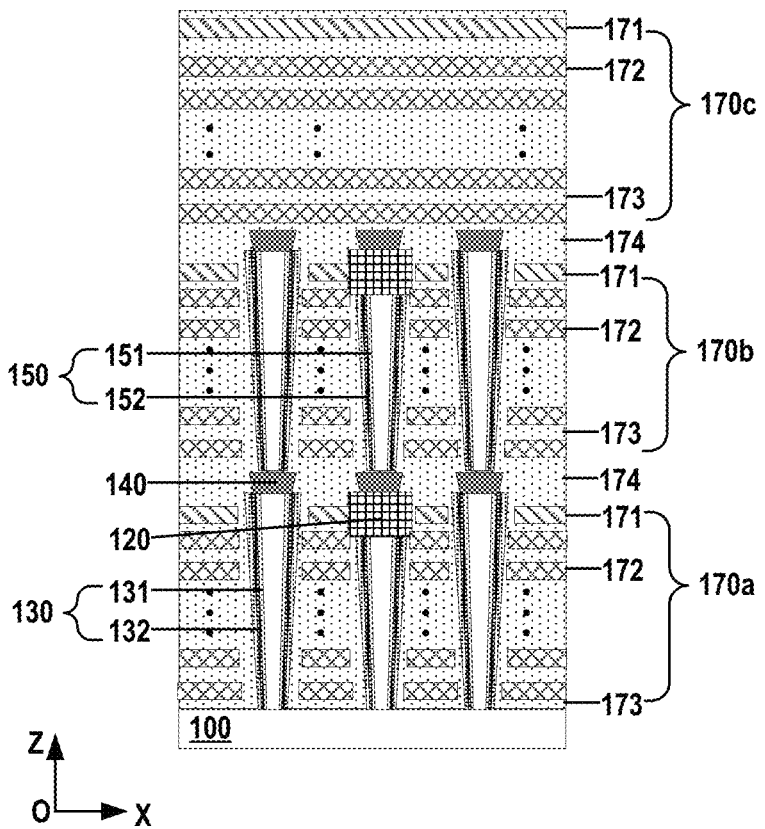

S600: as shown in FIG. 8e, forming a plurality of channel structures 130 penetrating the second stack structure 170b and electrically connected to the channel structures in the first stack structure.

In some implementations, the material of the TSG sacrificial layer 171 may include, but not limited to, silicon oxide, silicon nitride, silicon oxynitride, monocrystalline silicon, polysilicon, or other suitable materials.

As shown in FIG. 8e, the memory device includes the first stack structure 170a and the second stack structure 170b, and the TSG cutting line 120, the channel structure 130, and the conductive portion 140 are formed in each stack structure. The TSG cutting line 120 divides the channel structures 130 in each stack structure into insulated memory blocks and can separately perform read/write/erase operations on the memory blocks.

It should be noted that, in the Z-direction, the channel structures 130 in the first stack structure 170a and the channel structures 130 in the second stack structure 170b are stacked with each other. In the Z-direction, adjacent stacked channel structures 130 are electrically connected with each other. The electrical connections may include direct contact between the channel structures 130 to form an electrical connection, such as the semiconductor channels in the two channel structures 130 contact each other. In some implementations, the manner of electrically connecting may also include providing a conductive structure (e.g., conductive portion 140) between two channel structures 130 in the Z-direction.

As shown in FIG. 8e, the stack structure includes a gate sacrificial layer 172 and an insulating layer 173 stacked alternately. The gate sacrificial layer 172 of the stack structure is replaced with the gate layer 112 to form the stack structure 110 shown in FIG. 2a.

It is understood that the first stack structure 170a and the second stack structure 170b in the disclosure is for illustration only, and are not limited to two stack structures. In some implementations, a third stack structure, a fourth stack structure, and an n-th stack structure, wherein n is a natural number not less than 2, may be formed as well. In each stack structure, the number of stacked layers may include 8, 16, 32, 64, 96, 128, etc., and is not specifically limited.

According to design and process requirements, in some implementations, step S400, step S500 and step S600 may be repeated, more stack structures can be stacked, and the TSG cutting line 120 and the channel structure 130 may be formed in each stack structure to increase the memory density of the 3D memory device.

In some implementations, in step S200 and step S500, a plurality of TSG cutting lines 120 may also be provided in each stack structure, and the TSG sacrificial layer 171 is divided into a plurality of insulated regions, so as to obtain more memory blocks that can independently perform the read/write/erase operations.

It should be noted that in the Z-direction perpendicular to the substrate 100, the memory blocks in the stack structures can independently perform the read/written/erase operations, and are not interfered with by the upper and lower adjacent memory blocks. For example, when the read/write/erase operations are performed on the memory block of the first stack structure 170a, the memory block in the second stack structure 170b, and the memory block in the third stack structure 170c may not perform the read/write/erase operations. In this way, more fine control of the memory device can be realized, the operation efficiency is improved, the programming interference between the memory blocks is reduced, and the stability of the memory device is improved.

In some implementations, as shown in FIG. 8e, the projection of the second TSG cutting line 120 overlaps the projection of the first TSG cutting line 120 in a direction perpendicular to the substrate 100. In the process of forming the TSG cutting line 120, the TSG cutting line 120 is formed by determining the position of the TSG cutting line 120 using photolithography techniques, and then performing the etch process and the deposition process. The forming position of the first TSG cutting line 120 in the first stack structure 170a may be the same as the forming position of the second TSG cutting line 120 in the second stack structure 170b, so that the projection of the first TSG cutting line 120 and the second TSG cutting line 120 in the Z-direction overlap. Therefore, in the manufacturing process of the first TSG cutting line 120 and the second TSG cutting line 120, the same mask can be used to reduce the manufacturing cost.

In some implementations, as shown in FIG. 8b and FIG. 8d, in step S200 and step S500, the method for forming the TSG cutting line 120 may include forming a first trench 121 penetrating the TSG sacrificial layer 171 in the stack structure, and filling the first trench 121 with a dielectric material to form the TSG cutting line 120. In some implementations, the dielectric material may include an insulating material such as silicon oxide, silicon nitride, silicon oxynitride, or other suitable materials. In some implementations, the process of forming the first trench may include dry etching, wet etching, or other suit processes. It is understood that the TSG sacrificial layer 171 may be a single-layer material layer or may include a plurality of TSG sublayers to increase the depth of the first trench 121 and enhance the partition and insulation capabilities of the formed TSG cutting line 120.

Figure 8F:
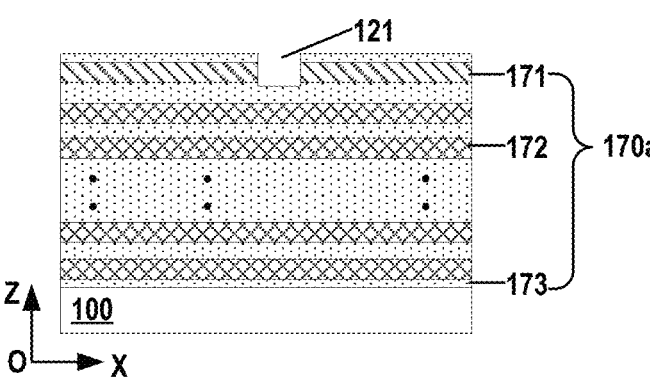

As shown in FIG. 8f, a first trench 121 is formed in the first stack structure 170a, and then the first trench 121 is filled to form an insulated TSG cutting line 120. It is understood that, the method of forming the TSG cutting line 120 in the second stack structure 170b, in the third stack structure 170c, and in the n-th stacked structure may be the same as the method for forming the TSG cutting line 120 in the first stack structure 170a. In some implementations, after filling the first trench with the dielectric material and forming the TSG cutting line, the dielectric material may overflow from the first trench, resulting in different surface flatness of the stack structure, and the surface may be further treated by using a chemical mechanical polishing (CMP) process to improve the flatness.

In some implementations, as shown in FIG. 8c and FIG. 8e, before performing the step S400, the method may further include forming a plurality of conductive portions 140 on the first stack structure 170a, wherein the conductive portions 140 are electrically connected to the channel structures 130 in the first stack structure 170a. After the second stack structure 170b is formed, the conductive portion 140 is electrically connected to the two channel structures 130 stacked in the first stack structure 170a and the second stack structure 170b.

As shown in FIG. 8e, in the Z-direction, the conductive portion 140 is formed between two adjacent channel structures 130 disposed in a stacked manner, and is in contact with the top of one channel structure 130 and the bottom of the other channel structure 130, so as to realize the electrical connection of the two channel structures 130. The conductive portion 140 may increase the electrical connection area of the two channel structures 130, reduce the difficulty of alignment of the two channel structures 130, and facilitate the expansion of the process window forming the channel structures 130.

In some implementations, the material of the conductive portion 140 may include tungsten, cobalt, nickel, titanium, polysilicon, or other suitable materials. In some implementations, the material of the conductive portion 140 may include the polysilicon material and the polysilicon material may also be ion-doped to increase the carrier density of the conductive portion 140 and enhance the conductivity. In some implementations, the n-type doping may be performed on the polysilicon of the conductive portion 140 to form an n-type polysilicon semiconductor, and the doping ions may include phosphorus, arsenic, antimony, or other suitable materials.

In some implementations, as shown in FIG. 8c and FIG. 8e, the channel structure 130 includes the semiconductor channel 131 and the memory film 132 disposed around the semiconductor channel 131. In step S300 and step S600, the method for forming the channel structure 130 includes forming a channel hole penetrating the stack structure, forming a memory film 132 covering the sidewall of the channel hole, and forming a semiconductor channel 131 covering the memory film 132, wherein the semiconductor channels 131 stacked on each other in the two stack structures are electrically connected by the conductive portion 140.

In some implementations, the process of forming the channel holes includes dry etching, wet etching, or other suitable processes. In some implementations, the process of forming the memory film 132 and the semiconductor channel 131 may be any process known to those skilled in the art, such as a low-temperature chemical vapor deposition (LPCVD) process, a low pressure chemical vapor deposition (LPCVD) process, a rapid thermal chemical vapor deposition (ALD) process, an atomic layer deposition (ALD) process, a plasma enhanced chemical vapor deposition (PECVD) process, or other suitable processes.

In the Z-direction perpendicular to the substrate 100, the adjacent stack semiconductor channels 131 are electrically connected through the conductive portions 140, so that the conduction of each semiconductor channel 131 can be realized.

In some implementations, before forming the conductive portion 140, the method may further include forming an isolation layer 174 covering the first stack structure 170a and the TSG cutting line 120, and forming a plurality of conductive portions 140 on the first stack structure 170a, including forming a plurality of conductive portions 140 in the isolation layer 174, wherein the plurality of conductive portions 140 are electrically isolated from each other in the direction parallel to the substrate 100. In some implementations, the material of the isolation layer 174 may include an insulating material such as silicon oxide, silicon nitride, silicon oxynitride, or other suitable materials.

The isolation layer 174 is formed on the top of the first stack structure 170a and the top of the TSG cutting line 120, and a plurality of conductive portions 140 are formed in the isolation layer 174, so that the plurality of conductive portions 140 are electrically isolated from each other by the isolation layer 174 in the X-direction parallel to the substrate 100, thereby reducing the programming interference between the conductive portions 140. In some implementations, the groove is formed in the isolation layer 174 by etching operations, and then the groove is filled with the conductive material to form the conductive portion 140. The isolation layer 174 can provide a flatter contact surface, which is beneficial to the deposition of the materials, so that the second stack structure 170b formed on the isolation layer 174 is more uniform, which is beneficial to the formation of more stack structures and increases the number of memory layers.

In some implementations, as shown in FIG. 8a and FIG. 8e, in step S100 and step S400, the method for forming a stack structure includes forming alternately stacked gate sacrificial layers 172 and insulating layers 173 on the substrate 100, and forming the TSG sacrificial layer 171 on a side of the stack structure opposite to the substrate 100. The insulating layer 173 electrically isolates the TSG sacrificial layer 171 from the adjacent gate sacrificial layer 172.

In some implementations, step S300 may be performed before step S200. In some implementations, step S600 may be performed before step S500. For example, the channel structure 130 may be formed first and then the TSG cutting line 120 may be formed in the stack structure.

As shown in FIG. 8c and FIG. 8e, the method may further include forming a dummy channel hole penetrating the alternately stacked gate sacrificial layer 172 and the insulating layer 173 under the TSG cutting line 120, forming the dummy memory film 152 covering the dummy channel hole, forming the dummy semiconductor channel 151 covering the dummy memory film 152, forming the insulating layer 173 between the TSG sacrificial layer 171 and the gate sacrificial layer 172 to form electrical isolation to prevent over-etching of the TSG sacrificial layer 171 during the formation of the TSG cutting line 120 extending into the gate sacrificial layer 172 and destroying the gate sacrificial layer 172 that affects the stability of the memory device.

The dummy channel structures 150 are formed below the TSG cutting lines 120, and the dummy channel structures 150 in the adjacent memory arrays are electrically isolated by the TSG cutting lines 120. The read/write/erase operations are not performed on the dummy channel structures 150, and the dummy channel structures 150 are used to support the stack structure. The dummy channel structures 150 may be formed simultaneously with the channel structures 130 of step S300 and step S600 by using the same manufacturing process, and may have the same structure, so as to simplify the process steps and reduce the manufacturing cost.

In some implementations, after the step S600, a second trench may be formed penetrating each stack structure. The second trench may extend into the substrate. The gate sacrificial layer 172 and the TSG sacrificial layer 171 are removed based on the second trench to form a gap between adjacent insulating layers 173. The gap is filled with the conductive material to form the gate layer 112 and the TSG 111, as shown in FIG. 2b. The gate layers 112 is used as word lines and different operating voltages may be applied to the word lines to turn on/off the semiconductor channel and perform the read/write/erase operations of the memory device. The TSG 111 is used as a control gate of the top selection transistor, and the semiconductor channel is turned on/off by applying different operation voltages, so as to implement the read/write/erase operations of the memory device.

In some implementations, as shown in FIG. 2a, the 3D Memory device may include memory arrays stacking in a first direction, e.g., the Z-direction. Each memory array may include a stack structure including interleaved conductive layers and first dielectric layers, e.g., the insulating layer 113, extending in a second direction, e.g., the X-direction, perpendicular to the first direction and a third direction, e.g., the Y-direction, perpendicular to the first direction and the second direction. The conductive layers may include word lines, e.g., the gate layer 112, and a drain select gate line, e.g., the TSG 111. In some implementations, the drain select gate line is separated by a second dielectric layer, e.g., the TSG cutting line 120, in the second direction.

In some implementations, a first channel structure, e.g., the channel structure 130, may extend in the first direction through the word lines and the drain select gate line. In some implementations, a second channel structure, e.g., the dummy channel structure 150, may extend in the first direction through the word lines. It is noted that the channel structure 130 may penetrate all the gate layer 112, the insulating layer 113, and the TSG 111, and the dummy channel structure 150 may penetrate only the gate layer 112 and the insulating layer 113. Therefore, a first length of the channel structure 130 in the first direction is larger than a second length of the dummy channel structure 150 in the first direction, as shown in FIG. 2a. In some implementations, the TSG cutting line 120 is disposed above the dummy channel structure 150.

In some implementations, a first semiconductor layer, e.g., the conductive portion 140, may be disposed above the channel structure 130, and a second semiconductor layer, e.g., the dummy conductive portion 180, may be disposed above the TSG cutting line 120.

In some implementations, the memory device may include more than one memory array stacking together, as shown in FIG. 2a. For example, the memory device may include a first memory array and a second memory array disposed above the first memory array. The TSG cutting line 120 of the first memory array may at least partially overlap the TSG cutting line 120 of the second memory array. In some implementations, the TSG cutting line 120 of the first memory array may completely overlap the TSG cutting line 120 of the second memory array in a plan view of the 3D memory device, as shown in FIG. 2b.

In some implementations, the dummy conductive portion 180 of the first memory array may at least partially overlap the dummy conductive portion 180 of the second memory array in the plan view of the 3D memory device. In some implementations, the dummy conductive portion 180 of the first memory array may completely overlap with the dummy conductive portion 180 of the second memory array in the plan view of the 3D memory device.

In some implementations, the channel structures 130 of the first memory array and the second memory array are in electric contact with the conductive portion 140 disposed between the first memory array and the second memory array. In some implementations, the channel structures 130 of the first memory array and the second memory array are in direct contact with the conductive portion 140 disposed between the first memory array and the second memory array. In other words, the channel structures 130 of the first memory array and the second memory array are electric connected by the conductive portion 140 disposed between the first memory array and the second memory array.

In some implementations, after forming each memory array structure, a planarization operation, such as the CMP operation, may be performed to make the top surface flat. In other words, in some implementations, the top surface of the conductive portion 140 may be coplanar to the dummy conductive portion 180 in the X-direction and the Y-direction.

In some implementations, as shown in FIG. 2*a*, the 3D Memory device may include memory arrays stacking in a first direction, e.g., the Z-direction. For example, the 3D Memory device may include a first stack structure and a second stack structure. The first stack structure may include interleaved first conductive layers, the gate layer 112 and the TSG 111, and first dielectric layers, e.g., the insulating layer 113, extending in the X-direction and the Y-direction. The second stack structure may also include interleaved first conductive layers, the gate layer 112 and the TSG 111, and first dielectric layers, e.g., the insulating layer 113, extending in the X-direction and the Y-direction. In some implementations, the structure of the first stack structure may be the same as the second stack structure, and the first stack structure and the second stack structure are stacked in the Z-direction.

The memory device may also include one or more than one first channel structure, e.g., the channel structures 130, extending in the Z-direction through the first stack structure, and one or more than one second channel structure, e.g., the channel structures 130, extending in the Z-direction through the second stack structure.

The memory device may further include at least one first cutting structure, e.g., the TSG cutting line 120, disposed between the first channel structures, and at least one second cutting structure, e.g., the TSG cutting line 120, disposed between the second channel structures. In other words, as shown in FIG. 2*a*, each and every stack structure may separately include the TSG cutting line 120. Therefore, each stack structure 110 of each memory array may have the TSG 111, the TSG 111 may be a conductive layer parallel to the substrate 100, and the plurality of channel structures 130 may share the same TSG 111. The TSG 111 serves as a control gate of the top select transistor, and the top select transistor is turned on or off by controlling the voltage of the TSG 111, so as to control the channel structure 130 to implement read/write/erase operations. The TSG 111 is divided into two electrically insulated regions by the TSG cutting line 120 penetrating the TSG 111, so that each memory array is divided into two electrically insulated memory blocks 210.

In some implementations, the memory device may also include a first dummy channel structure, e.g., the dummy channel structure 150, extending in the first stack structure in the Z-direction, and a second dummy channel structure, e.g., the dummy channel structure 150, extending in the second stack structure in the Z-direction above the first dummy channel structure. The first cutting structure, e.g., the TSG cutting line 120, is disposed between the first dummy channel structure and the second dummy channel structure.

In some implementations, the first dummy channel structure, the first cutting structure, and the second dummy channel structure may at least partially overlap in the plan view of the 3D memory device.

Figure 9:
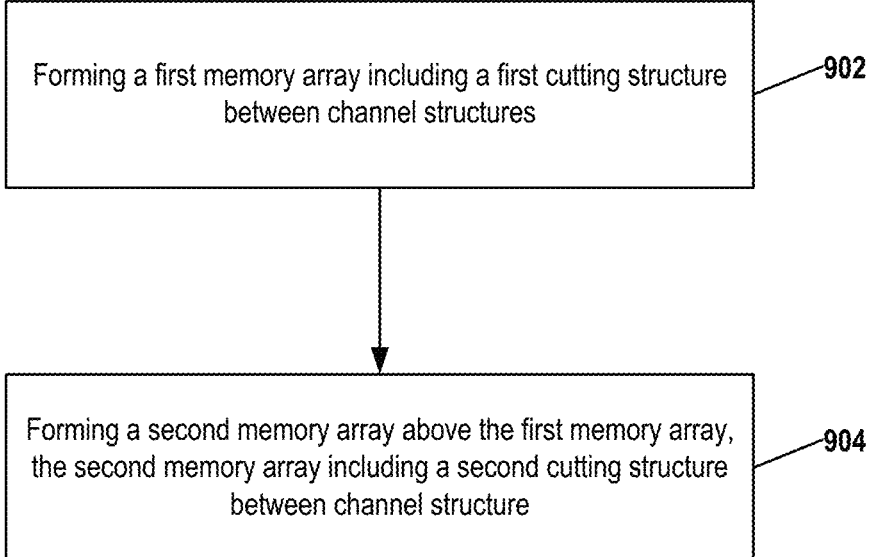
FIG. 9 illustrates a flowchart of a method for forming a 3D memory device, according to some aspects of the present disclosure.

FIG. 9 illustrates a flowchart of a method for forming a 3D memory device, according to some aspects of the present disclosure. As shown in operation 902 of FIG. 9, a first memory array including a first cutting structure between first channel structures is formed.

In some implementations, as shown in FIG. 8*a*, a first dielectric stack, e.g., the stack structure 170*a*, is formed. The first dielectric stack includes interleaved first dielectric layers, e.g., the insulating layer 173, and first sacrificial layers, e.g., the gate sacrificial layer 172 and the TSG sacrificial layer 171, stacking in the z-direction.

The first channel structures, e.g., the channel structures 130, are formed through the first dielectric stack in the Z-direction. The first cutting structure, e.g., the TSG cutting line 120, is formed in a topmost layer of the first sacrificial layers. In some implementations, the first channel structures may be formed before the first cutting structure. In some implementations, the first cutting structure may be formed before the first channel structures. Then the first sacrificial layers are replaced with first conductive layers. In some implementations, the first conductive layers may include the gate layer 112 and the TSG 111.

In some implementations, a first stack structure may be formed. The first stack structure may include first word lines and a first drain select gate line. The first word lines and the first drain select gate line are stacked in the Z-direction. Then, the first cutting structure is formed to cut the first drain select gate line. The first channel structure is formed extending in the Z-direction in the first stack structure.

In some implementations, a semiconductor layer, e.g., the conductive portion 140, may be formed on the first channel structure.

As shown in operation 904 of FIG. 9, a second memory array is formed above the first memory array, the second memory array including a second cutting structure between second channel structures.

In some implementations, as shown in FIG. 8*d*, a second dielectric stack, e.g., the stack structure 170*b*, is formed. The second dielectric stack includes interleaved second dielectric layers, e.g., the insulating layer 173, and second sacrificial layers, e.g., the gate sacrificial layer 172 and the TSG sacrificial layer 171, stacking in the z-direction.

As shown in FIG. 8*e*, the second channel structures, e.g., the channel structures 130, are formed through the second dielectric stack in the Z-direction. The second cutting structure, e.g., the TSG cutting line 120, is formed in a topmost layer of the second sacrificial layers. In some implementations, the second channel structures may be formed before the second cutting structure. In some implementations, the second cutting structure may be formed before the second channel structures. Then the second sacrificial layers are replaced with second conductive layers. In some implementations, the second conductive layers may include the gate layer 112 and the TSG 111.

In some implementations, a second stack structure may be formed. The second stack structure may include second word lines and a second drain select gate line. The second word lines and the second drain select gate line are stacked in the Z-direction. Then, the second cutting structure is formed to cut the second drain select gate line. The second channel structure is formed extending in the Z-direction in the second stack structure.

In some implementations, the TSG cutting line 120 of the first memory array may at least partially overlap with the TSG cutting line 120 of the second memory array. In some implementations, the TSG cutting line 120 of the first memory array may completely overlap the TSG cutting line 120 of the second memory array in a plan view of the 3D memory device, as shown in FIG. 2*b*.

In some implementations, a third memory array may be further formed above the second memory array. The third memory array may include a third cutting structure between third channel structures. In some implementations, the structures of the first memory array, the second memory array, and the third memory array may be the same.

By using the method disclosed in the implementations, each stack structure 110 of each memory array may have the TSG 111, the TSG 111 may be a conductive layer parallel to the substrate 100, and the plurality of channel structures 130 may share the same TSG 111. The TSG 111 serves as a control gate of the top select transistor, and the top select transistor is turned on or off by controlling the voltage of the TSG 111, so as to control the channel structure 130 to implement read/write/erase operations. The TSG 111 is divided into two electrically insulated regions by the TSG cutting line 120 penetrating the TSG 111, so that each memory array is divided into two electrically insulated memory blocks 210.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A three-dimensional (3D) memory device, comprising: memory arrays stacking in a first direction, each of the memory arrays comprising:
   a stack structure comprising interleaved conductive layers and first dielectric layers extending in a second direction perpendicular to the first direction and a third direction perpendicular to the first direction and the second direction, the conductive layers comprising word lines and a drain select gate line, and the drain select gate line being separated by a second dielectric layer in the second direction; and
   a conductive portion disposed on and in direct contact with the second dielectric layer.

2. The 3D memory device of claim 1, wherein each of the memory arrays further comprises:
   a first channel structure extending in the first direction through the word lines and the drain select gate line.

3. The 3D memory device of claim 2, wherein each of the memory arrays further comprises:
   a second channel structure extending in the first direction through the word lines.

4. The 3D memory device of claim 3, wherein the second dielectric layer is disposed above the second channel structure and is in contact with the second channel structure.

5. The 3D memory device of claim 3, wherein a first length of the first channel structure in the first direction is larger than a second length of the second channel structure in the first direction.

6. The 3D memory device of claim 3, wherein each of the memory arrays further comprises:
   a first semiconductor layer disposed above the first channel structure.

7. The 3D memory device of claim 6, wherein memory arrays comprise a first memory array and a second memory array disposed above the first memory array, and the second dielectric layer of the first memory array at least partially overlaps the second dielectric layer of the second memory array in a plan view of the 3D memory device.

8. The 3D memory device of claim 7, wherein the conductive portion of the first memory array at least partially overlaps the conductive portion of the second memory array in the plan view of the 3D memory device.

9. A three-dimensional (3D) memory device, comprising:
   a first stack structure comprising interleaved first conductive layers and first dielectric layers extending in a first direction and a second direction perpendicular to the first direction;
   first channel structures extending in a third direction perpendicular to the first direction and the second direction through the first stack structure;
   a second stack structure disposed above the first stack structure, comprising interleaved second conductive layers and second dielectric layers extending in the first direction and the second direction;
   second channel structures extending in the third direction through the second stack structure;
   a first cutting structure disposed between the first channel structures;
   a second cutting structure disposed between the second channel structures;
   a first dummy channel structure extending in the first stack structure in the third direction; and
   a second dummy channel structure extending in the second stack structure in the third direction above the first dummy channel structure, wherein the first cutting structure is disposed between the first dummy channel structure and the second dummy channel structure; and
   a first conductive portion disposed between the first cutting structure and the second dummy channel structure and in direct contact with the first cutting structure.

10. The 3D memory device of claim 9, wherein the first dummy channel structure, the first cutting structure, and the second dummy channel structure at least partially overlap in a plan view of the 3D memory device.

11. The 3D memory device of claim 9, wherein the first conductive layers of the first stack structure comprise word lines and a drain select gate line, and the drain select gate line being separated by the first cutting structure.

12. The 3D memory device of claim 9, wherein the second conductive layers of the second stack structure comprise word lines and a drain select gate line, and the drain select gate line being separated by the second cutting structure.

13. The 3D memory device of claim 9, further comprising:
   a second conductive portion disposed on the second cutting structure.

14. A method for forming a three-dimensional (3D) memory device, comprising:

forming a first memory array comprising a first cutting structure between first channel structures and a conductive portion above and in direct contact with the first cutting structure; and forming a second memory array above the first memory array, the second memory array comprising a second cutting structure between second channel structures.

15. The method of claim 14, wherein forming the first memory array comprising the first cutting structure between first channel structures and the conductive portion above and in direct contact with the first cutting structure, comprises:

forming a first dielectric stack comprising interleaved first dielectric layers and first sacrificial layers stacking in a first direction;

forming the first channel structures through the first dielectric stack in the first direction;

forming the first cutting structure in a topmost layer of the first sacrificial layers; and forming the conductive portion above and in direct contact with the first cutting structure and the first channel structures.

16. The method of claim 15, further comprising:

replacing the first sacrificial layers with first conductive layers.

17. The method of claim 15, wherein forming the second memory array above the first memory array, comprises:

forming a second dielectric stack on the first memory array, the second dielectric stack comprising interleaved second dielectric layers and second sacrificial layers stacking in the first direction;

forming the second channel structures through the second dielectric stack in the first direction; and forming the second cutting structure in a topmost layer of the second sacrificial layers.

18. The method of claim 14, wherein forming the first memory array comprising the first cutting structure between first channel structures and the conductive portion above and in direct contact with the first cutting structure, comprises:

forming a first stack structure comprising first word lines and a first drain select gate line, wherein the first word lines and the first drain select gate line stacking in a first direction;

forming the first cutting structure to cut the first drain select gate line; and forming the first channel structure extending in the first direction in the first stack structure.

19. The method of claim 18, wherein forming the second memory array above the first memory array, comprises:

forming a second stack structure on the first stack structure, the second stack structure comprising second word lines and a second drain select gate line, wherein the second word lines and the second drain select gate line stacking in the first direction;

forming the second cutting structure to cut the second drain select gate line; and forming the second channel structures extending in the first direction in the second stack structure.

20. The method of claim 14, wherein forming the second memory array above the first memory array, comprises:

forming the second cutting structure at least partially overlapping the first cutting structure in a plan view of the 3D memory device.

* * * * *